US011281601B2

(12) United States Patent
Subbarao et al.

(10) Patent No.: US 11,281,601 B2
(45) Date of Patent: Mar. 22, 2022

(54) MULTI-DEVICE STORAGE SYSTEM WITH HOSTED SERVICES ON PEER STORAGE DEVICES

(71) Applicant: Western Digital Technologies, Inc., San Jose, CA (US)

(72) Inventors: Sanjay Subbarao, Irvine, CA (US); Vladislav Bolkhovitin, San Jose, CA (US); Anand Kulkarni, San Jose, CA (US); Brian Walter O'Krafka, Austin, TX (US)

(73) Assignee: Western Digital Technologies, Inc., San Jose, CA (US)

( * ) Notice: Subject to any disclaimer, the term of this patent is extended or adjusted under 35 U.S.C. 154(b) by 19 days.

(21) Appl. No.: 16/913,596

(22) Filed: Jun. 26, 2020

(65) Prior Publication Data

US 2020/0327074 A1 Oct. 15, 2020

Related U.S. Application Data

(62) Division of application No. 16/024,738, filed on Jun. 30, 2018, now Pat. No. 10,725,941.

(51) Int. Cl.
*G06F 11/00* (2006.01)
*G06F 13/16* (2006.01)
(Continued)

(52) U.S. Cl.
CPC ........ *G06F 13/1668* (2013.01); *G06F 3/0604* (2013.01); *G06F 3/067* (2013.01);
(Continued)

(58) Field of Classification Search
CPC .. G06F 11/1068; G06F 3/0607; G06F 3/0659; G06F 3/067; G06F 3/0604; G06F 3/0656; G11C 29/52
See application file for complete search history.

(56) References Cited

U.S. PATENT DOCUMENTS 5,208,813 A * 5/1993 Stallmo ............... G06F 11/1092
714/6.32
5,220,653 A 6/1993 Miro
(Continued)

FOREIGN PATENT DOCUMENTS

WO 2013022915 A1 2/2013

OTHER PUBLICATIONS

International Search Report and Written Opinion of Application No. PCT/US2018/052376, dated Dec. 10, 2018 (13 pages).
(Continued)

*Primary Examiner* — Esaw T Abraham
(74) *Attorney, Agent, or Firm* — Patent Law Works LLP

(57) ABSTRACT

Example multi-device storage systems, storage devices, and methods provide hosted services on peer storage devices. Storage devices include a storage medium, a logical mapping memory, and a processor for executing hosted services using the logical mapping memory. Each storage device is configured to communicate with peer storage devices over an interconnect fabric. The logical mapping memory includes storage device media logical mapping information configured in continuous logical blocks with a media block size equal to a page programming size of the storage medium. The logical mapping memory also includes host logical mapping information, configured in host logical blocks with a host block size smaller than the media block size, for the peer storage devices.

20 Claims, 8 Drawing Sheets

(51) Int. Cl.
    *G06F 11/10*    (2006.01)
    *G11C 29/52*    (2006.01)
    *G06F 3/06*    (2006.01)
    *G06F 13/40*    (2006.01)

(52) U.S. Cl.
    CPC .......... *G06F 3/0656* (2013.01); *G06F 3/0659* (2013.01); *G06F 11/1068* (2013.01); *G06F 13/4027* (2013.01); *G11C 29/52* (2013.01)

(56) References Cited

U.S. PATENT DOCUMENTS

| | | | |
|---|---|---|---|
| 5,530,948 A | 6/1996 | Islam | |
| 7,162,582 B2 | 1/2007 | Horn et al. | |
| 7,680,837 B2 | 3/2010 | Yamato | |
| 7,934,055 B2 | 4/2011 | Flynn et al. | |
| 7,996,645 B2 * | 8/2011 | New | G06F 3/0608 |
| | | | 711/201 |
| 8,307,359 B1 | 11/2012 | Brown et al. | |
| 8,473,648 B2 | 6/2013 | Chakhaiyar et al. | |
| 8,583,853 B1 | 11/2013 | Lee et al. | |
| 8,819,273 B2 * | 8/2014 | Jung | H04L 67/1008 |
| | | | 709/238 |
| 9,009,565 B1 | 4/2015 | Northcott et al. | |
| 9,053,167 B1 | 6/2015 | Swift et al. | |
| 9,098,406 B2 | 8/2015 | Solihin | |
| 9,118,698 B1 | 8/2015 | Radovanovic | |
| 9,300,574 B2 | 3/2016 | Ditya | |
| 9,389,805 B2 | 7/2016 | Cohen et al. | |
| 9,438,665 B1 | 9/2016 | Vasanth et al. | |
| 9,448,924 B2 | 9/2016 | Sundaram et al. | |
| 9,645,917 B2 * | 5/2017 | Small | G06F 12/0246 |
| 9,720,596 B1 | 8/2017 | Bono et al. | |
| 9,780,829 B1 | 10/2017 | Faragher et al. | |
| 9,794,186 B2 * | 10/2017 | Xiao | H04L 61/2557 |
| 9,904,490 B2 | 2/2018 | Horspool et al. | |
| 10,075,750 B2 | 9/2018 | Gordon et al. | |
| 10,164,897 B1 * | 12/2018 | Gussin | H04L 67/16 |
| 10,170,151 B2 * | 1/2019 | Aiello | G06F 3/064 |
| 10,476,846 B2 | 11/2019 | Bentley | |
| 10,687,121 B2 * | 6/2020 | Yang | H04N 21/236 |
| 2003/0046497 A1 | 3/2003 | Dandrea | |
| 2005/0149933 A1 | 7/2005 | Saito et al. | |
| 2008/0034153 A1 | 2/2008 | Lee et al. | |
| 2009/0150605 A1 | 6/2009 | Flynn et al. | |
| 2011/0072207 A1 | 3/2011 | Jin et al. | |
| 2011/0246996 A1 | 10/2011 | Tunning | |
| 2012/0179869 A1 | 7/2012 | Flynn et al. | |
| 2012/0278686 A1 | 11/2012 | Tang et al. | |
| 2012/0284460 A1 | 11/2012 | Guda | |
| 2013/0007183 A1 | 1/2013 | Sorenson, III et al. | |
| 2013/0046949 A1 | 2/2013 | Colgrove et al. | |
| 2014/0025770 A1 | 1/2014 | Warfield et al. | |
| 2014/0101369 A1 | 4/2014 | Tomlin et al. | |
| 2014/0258598 A1 | 9/2014 | Canepa et al. | |
| 2014/0365719 A1 | 12/2014 | Kuzmin et al. | |
| 2015/0067244 A1 | 3/2015 | Kruger | |
| 2015/0089282 A1 | 3/2015 | Taranta, II | |
| 2015/0169231 A1 | 6/2015 | Kanigicherla et al. | |
| 2015/0254178 A1 | 9/2015 | Van Aken | |
| 2016/0054920 A1 | 2/2016 | Patterson, III | |
| 2016/0070652 A1 | 3/2016 | Sundararaman et al. | |
| 2016/0179403 A1 | 6/2016 | Kurotsuchi et al. | |
| 2016/0320989 A1 | 11/2016 | Bromberg et al. | |
| 2016/0357461 A1 | 12/2016 | Tsao et al. | |
| 2016/0371145 A1 | 12/2016 | Akutsu et al. | |
| 2017/0177237 A1 | 6/2017 | Schnapp et al. | |
| 2017/0185543 A1 | 6/2017 | Nieuwejaar | |
| 2017/0206260 A1 | 7/2017 | Wei et al. | |
| 2018/0011801 A1 | 1/2018 | Sengupta et al. | |

OTHER PUBLICATIONS

International Search Report and Written Opinion of Application No. PCT/US2018/052389 ISR & WO, dated Dec. 10, 2018 (13 pages).
International Search Report and Written Opinion of Application No. PCT/US2019/020155 ISR & WO, dated Jun. 27, 2019 (11 pages).
International Search Report and Written Opinion of Application No. PCT/US2019/020165 ISR & WO, dated Jun. 21, 2019 (16 pages).
Zhang, Jiacheng, et al., ParaFS: A Log-Structured File System to Exploit the Internal Parallelism of Flahs Devices,: 2016 USENIX Annual Technical Conference, Jun. 22-24, 2016, 15 pages.

* cited by examiner

MULTI-DEVICE STORAGE SYSTEM WITH HOSTED SERVICES ON PEER STORAGE DEVICES

TECHNICAL FIELD

The present disclosure generally relates to data storage systems, and in a more particular example, to disaggregated multi-device data storage systems.

BACKGROUND

Multi-device storage systems utilize multiple discrete storage devices, generally disk drives (solid-state drives, hard disk drives, hybrid drives, tape drives, etc.) for storing large quantities of data. These multi-device storage systems are generally arranged in an array of drives interconnected by a common communication fabric and, in many cases, controlled by a storage controller, redundant array of independent disks (RAID) controller, or general controller, for coordinating storage and system activities across the array of drives. The data stored in the array may be stored according to a defined RAID level, a combination of RAID schemas, or other configurations for providing desired data redundancy, performance, and capacity utilization. In general, these data storage configurations may involve some combination of redundant copies (mirroring), data striping, and/or parity (calculation and storage), and may incorporate other data management, error correction, and data recovery processes, sometimes specific to the type of disk drives being used (e.g., solid-state drives versus hard disk drives).

There is an emerging trend in the storage industry to deploy disaggregated storage. Disaggregated storage brings significant cost savings via decoupling compute and storage node life cycles and allowing different nodes or subsystems to have different compute to storage ratios. In addition, disaggregated storage allows significant flexibility in migrating compute jobs from one physical server to another for availability and load balancing purposes.

Disaggregated storage has been implemented using a number of system architectures, including the passive Just-a-Bunch-of-Disks (JBOD) architecture, the traditional All-Flash Architecture (AFA), and Ethernet Attached Bunch of Flash (EBOF) disaggregated storage, which typically uses specialized chips from Mellanox or Kazan to translate commands from external NVMe-OF™ (Non-Volatile Memory Express™ over Fabrics) protocol to internal NVMe (NVM Express™) protocol. These architectures may not make the best use of the I/O bandwidth, processing, and buffer memory of the individual storage devices, such as solid-state drives (SSDs) in such systems. In addition, some of these architectures place significant compute resources in a centralized storage controller, which may lead to challenges scaling solutions as the number and size of SSDs increases.

Therefore, there still exists a need for disaggregated storage architectures that distribute memory and compute resources across storage devices, such as SSDs, and enable reliable data management services in the face of drive failures and/or system power interruptions.

SUMMARY

Various aspects for hosted services on peer storage devices, particularly, distributed data management services in multi-device storage systems are described. In an innovative aspect, a storage device comprises a processor, an operating memory, a remotely addressable memory, and a fabric interface configured to communicate with a plurality of peer storage devices over an interconnect fabric between the fabric interface and the plurality of peer storage devices. A service request handler is stored in the operating memory and executable by the processor to identify a requested hosted service from a service host request received through the fabric interface. A plurality of hosted services are stored in the operating memory and executable by the processor to access local memory resources and local compute resources for data management operations for the plurality of peer storage devices, including the requested hosted service.

In various embodiments, the remotely addressable memory is configured to allocate a transfer buffer space in the remotely addressable memory and the requested hosted service includes a data transfer between the transfer buffer space and at least one of the plurality of peer storage devices. The storage device may further comprise an erasure coding engine and the requested hosted service may further comprise an erasure coding operation using the erasure coding engine to erasure code data for the data transfer. The remotely addressable memory may be configured to allocate a parity buffer space in the remotely addressable memory. The requested hosted service may further comprise reading parity buffer data from the parity buffer space, erasure coding the parity buffer data read from the parity buffer space, and writing the erasure coded parity buffer data back to the parity buffer space.

In some embodiments, the storage device further comprises a logical mapping memory that includes storage device media logical mapping information for the storage device and host logical mapping information for at least one of the plurality of peer storage devices. The plurality of hosted services may include using at least one host logical block address to identify host logical mapping information from the logical mapping memory and sending the identified host logical mapping information to a requestor. The requested host service may further comprise updating the host logical mapping information based on a change in at least one of the plurality of peer storage devices. The requester for the requested host service may be at least one of the plurality of peer storage devices. The remotely addressable memory may be configured for allocating a log buffer space in the remotely addressable memory. The plurality of hosted services may include logging requested updates to the host logical mapping information in the log buffer space. The requested hosted service may include processing requested updates from the log buffer space after an initialization event. The host logical mapping information may include host logical mapping parity data for host logical mapping information stored in at least one of the plurality of peer storage devices. The requested hosted service may include recreating host logical mapping information from the host logical mapping parity data. The requested hosted service may include receiving a verification list of host logical block addresses, identifying host logical mapping information corresponding to the verification list of host logical block addresses, and generating a filtered list of host logical block addresses for garbage collection based on the identified host logical mapping information. Receiving the verification list of host logical block addresses may include a garbage collection module writing the verification list into the remotely addressable memory. Generating the filtered list of host logical block addresses may include writing the filtered list into the remotely addressable memory for access by the garbage collection module.

In some embodiments, the local memory resources are selected from the operating memory, the remotely addressable memory, or the logical mapping memory. The local compute resources may be selected from the processor or the erasure coding engine.

In another innovative aspect, a computer-implemented method for execution by a storage device provides distributed hosted services for peer storage devices. A remotely addressable memory is managed and a plurality of peer storage devices are communicated with over an interconnect fabric. A plurality of hosted services are stored for accessing local memory resources and local compute resources for data management operations for the plurality of peer storage devices. A service host request is received from a service requester. A requested hosted service is identified from the service host request. The requested hosted service is executed using the remotely addressable memory. A status message is returned to the service requester in response to the requested host service being completed.

In various embodiments, a transfer buffer space is allocated in the remotely addressable memory and data is transferred between the transfer buffer space and at least one of the plurality of peer storage devices. A parity buffer space may be allocated in the remotely addressable memory and parity buffer data may be read from the parity buffer space. The parity buffer data read from the parity buffer space may be erasure coded and the erasure coded parity buffer data may be written back to the parity buffer space.

In some embodiments, the method further comprises managing a logical mapping memory that includes storage device media logical mapping information for at least one storage medium in the storage device and host logical mapping information for at least one of the plurality of peer storage devices. Host logical mapping information may be identified from the logical mapping memory using at least one host logical block address and the identified host logical mapping information may be used for executing the requested hosted service. The host logical mapping information may be updated based on a change in at least one of the plurality of peer storage devices while executing the requested hosted service. A log buffer space may be allocated in the remotely addressable memory and requested updates to the host logical mapping information may be logged in the log buffer space. Requested updates may be processed from the log buffer space after an initialization event in response to the service host request. Host logical mapping parity data may be stored in the logical mapping memory for host logical mapping information stored in at least one of the plurality of peer storage devices. Host logical mapping information may be recreated from the host logical mapping parity data in response to the service host request.

In yet another innovative aspect, a storage device provides hosted services for peer storage devices. The storage device comprises at least one storage medium and a remotely addressable buffer memory. Means are provided for communicating with a plurality of peer storage devices over an interconnect fabric. Means are provided for storing a plurality of hosted services for accessing local memory resources and local compute resources for data management operations for the plurality of peer storage devices. Means are provided for receiving a service host request from a service requester. Means are provided for identifying a requested hosted service from the service host request. Means are provided for executing the requested hosted service using the remotely addressable buffer memory.

In yet another innovative aspect, a storage device comprises at least one storage medium and a fabric interface configured to communicate with a plurality of peer storage devices over an interconnect fabric between the fabric interface and the plurality of peer storage devices. A logical mapping memory includes storage device media logical mapping information and host logical mapping information. The storage device media logical mapping information is for the at least one storage medium and is configured in continuous logical blocks with a media block size equal to a page programming size of the at least one storage medium. The host logical mapping information is for at least one of the plurality of peer storage devices and is configured in host logical blocks with a host block size smaller than the media block size. A service request handler is configured to identify a requested hosted service from a service host request received through the fabric interface. A plurality of hosted services are configured to access the logical mapping memory for data operations for the plurality of peer storage devices and the service host request initiates at least one of the plurality of hosted services.

In some embodiments, a media manager is configured to manage a flash translation layer for the at least one storage medium. The media manager defines continuous logical blocks with the media block size in the at least one storage medium.

The various embodiments advantageously apply the teachings of disaggregated multi-device storage systems to improve the functionality of such computer systems. The various embodiments include operations to overcome or at least reduce the issues in the previous storage systems discussed above and, accordingly, are more scalable and reliable than other computer data storage architectures for some applications. That is, the various embodiments disclosed herein include hardware and/or software with functionality to improve the scalability and reliability of distributed data management operations, based on hosting services across a plurality of peer storage devices. Accordingly, the embodiments disclosed herein provide various improvements to storage systems.

It should be understood that language used in the present disclosure has been principally selected for readability and instructional purposes, and not to limit the scope of the subject matter disclosed herein.

DETAILED DESCRIPTION

Figure 1:
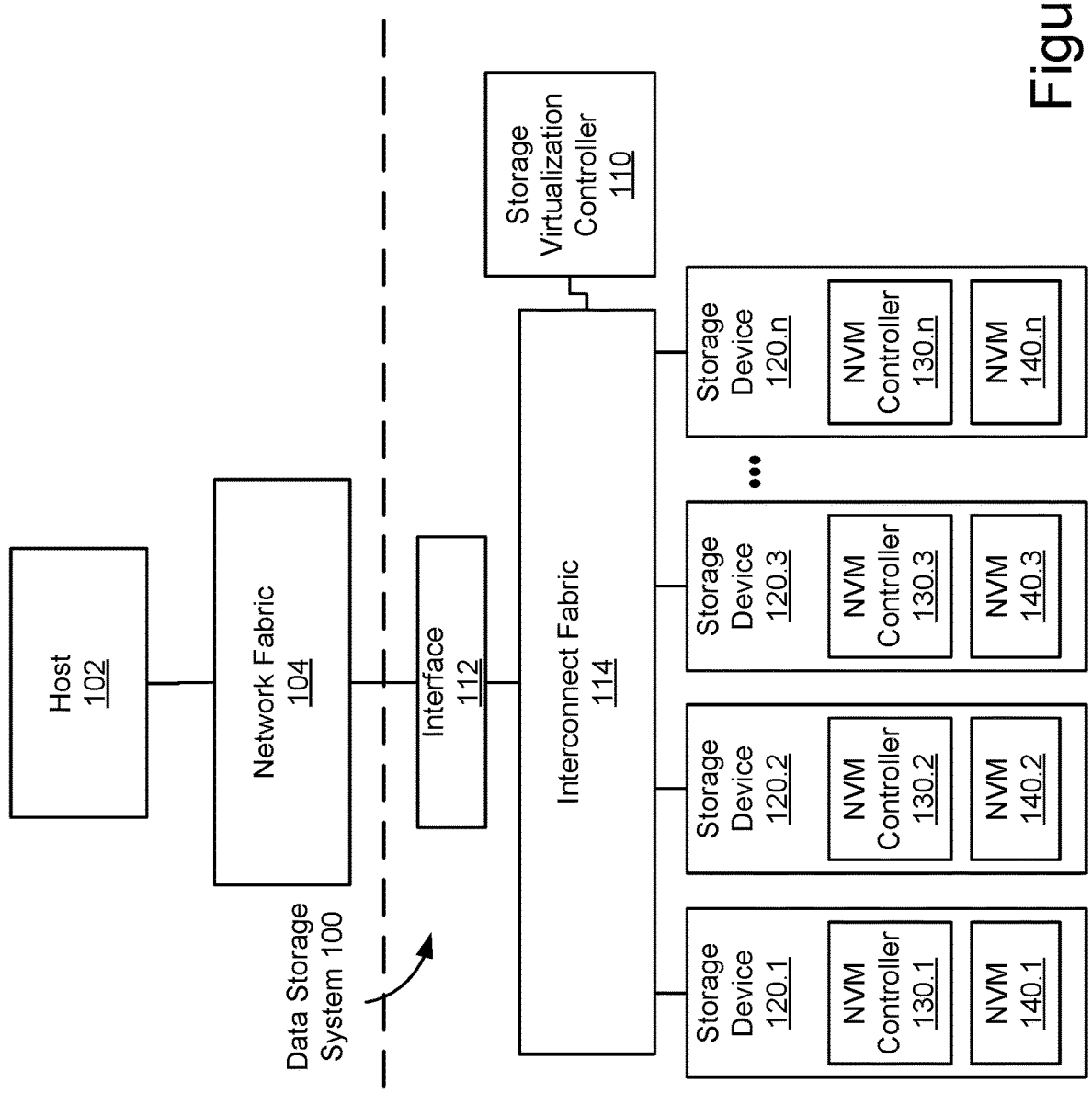
FIG. 1 schematically illustrates an example of a multi-device storage system.

FIG. 1 shows an embodiment of an example multi-device data storage system 100. While some example features are illustrated, various other features have not been illustrated for the sake of brevity and so as not to obscure pertinent aspects of the example embodiments disclosed herein. To that end, as a non-limiting example, data storage system 100 includes one or more data storage devices 120 (also sometimes called information storage devices, storage devices, or memory devices).

In some embodiments, the data storage devices 120 are, or include, solid-state drives (SSD's). Each data storage device 120.1-120.$n$ may include a non-volatile memory (NVM) controller 130 based on compute resources (processor and memory) and a plurality of NVM devices 140 for data storage (e.g., one or more NVM device(s), such as one or more flash memory devices). In some embodiments, a respective data storage device 120 of the one or more data storage devices includes one or more NVM controllers, such as flash controllers or channel controllers (e.g., for storage devices having NVM devices in multiple memory channels).

In some embodiments, a respective data storage device 120 may include a single NVM device 140 while in other embodiments the respective data storage device 120 includes a plurality of NVM devices. In some embodiments, NVM devices include NAND-type flash memory or NOR-type flash memory. In some embodiments, data storage device 120 includes one or more hard disk drives (HDDs). In some embodiments, data storage devices 120 may include a flash memory device, which in turn includes one or more flash memory die, one or more flash memory packages, one or more flash memory channels or the like. However, in some embodiments, one or more of the data storage devices 120 may have other types of non-volatile data storage medium or media (e.g., phase-change random access memory (PCRAM), resistive random-access memory (Re-RAM), Spin-transfer torque magnetic random-access memory (STT-RAM), magnetoresistive random-access memory (MRAM), etc.).

Storage virtualization controller (SVC) 110 is coupled to data storage devices 120.1-120.$n$ through interconnect fabric 114. However, in some embodiments, SVC 110 may be hosted as a component and/or a subsystem of another component of data storage system 100. For example, in some embodiments, some or all of the functionality of SVC 110 may be implemented by software executed on one or more compute resources in at least one of data storage devices 120.1-120.$n$, interconnect fabric 114, or interface 112. SVC 110 is sometimes called a controller system, a main controller system, a non-volatile memory express (NVMe) controller, garbage collection (GC) leader, storage controller, or storage virtualization controller. In some embodiments, an NVM controller 130.1 associated with a particular storage device (e.g., 120.1) acts as SVC 110 for other storage devices (e.g., 120-2, 120-3, and 120.$n$) in data storage system 100. In some embodiments, SVC 110 is a component and/or subsystem of host 102 (described below).

In some embodiments, host 102 is coupled to data storage system 100 through interface 112 over a network fabric 104. In some embodiments, multiple hosts 102 (only one of which is shown in FIG. 1) are coupled to data storage system 100 through interface 112, which may be a storage network interface or other interface capable of supporting communications with multiple hosts 102. Network fabric 104 may include a wired and/or wireless network (e.g., public and/or private computer networks in any number and/or configuration) which may be coupled in a suitable way for transferring data. For example, network fabric 104 may include any means of a conventional data communication network such as a local area network (LAN), a wide area network (WAN), a telephone network, such as the public switched telephone network (PSTN), an intranet, the internet, or any other suitable communication network or combination of communication networks.

Host 102, or a respective host in a system having multiple hosts, may be any suitable computer device, such as a computer, a laptop computer, a tablet device, a netbook, an internet kiosk, a personal digital assistant, a mobile phone, a smart phone, a gaming device, a computer server, or any other computing device. Host 102 is sometimes called a host system, client, or client system. In some embodiments, host 102 is a server system, such as a server system in a data center. In some embodiments, the one or more hosts 102 are one or more host devices distinct from SVC 110 and distinct from the plurality of storage devices 120; but in some other embodiments, the one or more hosts 102 include one of the storage devices 120 that has been configured to perform data processing operations and to send data storage commands to access data stored in the one or more storage devices 120. In some other embodiments, the one or more hosts 102 are configured to store and access data in the plurality of storage devices 120.

In some embodiments, data storage system 100 includes one or more processors, one or more types of memory, a display and/or other user interface components such as a keyboard, a touch screen display, a mouse, a track-pad, and/or any number of supplemental devices to add functionality. In some embodiments, data storage system 100 does not have a display and other user interface components.

The one or more NVM controllers 130, if included in a respective storage device 120, are coupled with SVC 110 through interconnect fabric 114. Interconnect fabric 114 is sometimes called a data connection, but typically convey commands in addition to data, and optionally convey metadata, error correction information and/or other information in addition to data values to be stored in NVM devices 140 and data values read from NVM devices 140.

In some embodiments, however, SVC 110, the one or more NVM controllers 130, and NVM devices 140 are included in the same device (i.e., an integrated device) as components thereof. Furthermore, in some embodiments, one or more of the storage devices 120 (e.g., including SVC 110, the one or more NVM controllers 130, and NVM devices 140) are embedded in a host device (e.g., host 102), such as a mobile device, tablet, other computer or computer-controlled device, and the methods described herein are performed, at least in part, by the embedded storage controller. In some embodiments, NVM controllers 130 are configured to both control one or more NVM devices 140 and provide distributed storage controller functions in conjunction with SVC 110.

In some embodiments, storage devices 120 include a plurality of NVM devices 140, such as flash memory devices, and optionally includes fewer NVM controllers 130. Viewed another way, in some embodiments, a storage device 120 includes multiple memory channels, each of which has an NVM controller 130 and a set of NVM devices 140 coupled to the NVM controller 130. However, in some embodiments, two or more memory channels share an NVM controller 130. In either example, each memory channel has its own distinct set of NVM devices 140. In a non-limiting example, the number of memory channels in a typical storage device is 8, 16, or 32. In another non-limiting example, the number of NVM devices 140 per memory channel is typically 8, 16, 32, or 64. Furthermore, in some embodiments, the number of NVM devices 140 in one memory channel is different from the number of NVM devices in another one of the memory channels.

In some embodiments, each NVM controller of NVM controllers 130 includes one or more processing units (also sometimes called CPUs or processors or microprocessors or microcontrollers) configured to execute instructions in one or more programs (e.g., in NVM controllers 130). In some embodiments, the one or more processors are shared by one or more components within, and in some cases, beyond the function of NVM controllers 130. As noted above, NVM devices 140 are coupled to NVM controllers 130 through connections that typically convey commands in addition to data, and optionally convey metadata, error correction information and/or other information in addition to data values to be stored in NVM devices 140 and data values read from NVM devices 140. NVM devices 140 may include any number (i.e., one or more) of memory devices including, without limitation, non-volatile semiconductor memory devices, such as flash memory device(s).

Flash memory device(s) (e.g., NVM devices 140) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) (e.g., NVM devices 140) can also be configured for relatively smaller-scale applications such as personal flash drives or hard-disk replacements for personal, laptop, and tablet computers. Although flash memory devices and flash controllers are used as an example here, in some embodiments storage device(s) 120 include other non-volatile memory device(s) and corresponding non-volatile storage controller(s).

In some embodiments, NVM devices 140 are divided into a number of addressable and individually selectable blocks, sometimes called erase blocks. In some embodiments, individually selectable blocks are the minimum size erasable units in a flash memory device. In other words, each block contains the minimum number of memory cells that can be erased simultaneously (i.e., in a single erase operation). Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector or codeword, which is a subunit of a page. That is, a block includes a plurality of pages, each page contains a plurality of sectors or codewords, and each sector or codeword is the minimum unit of data for reading data from the flash memory device.

Figure 2:
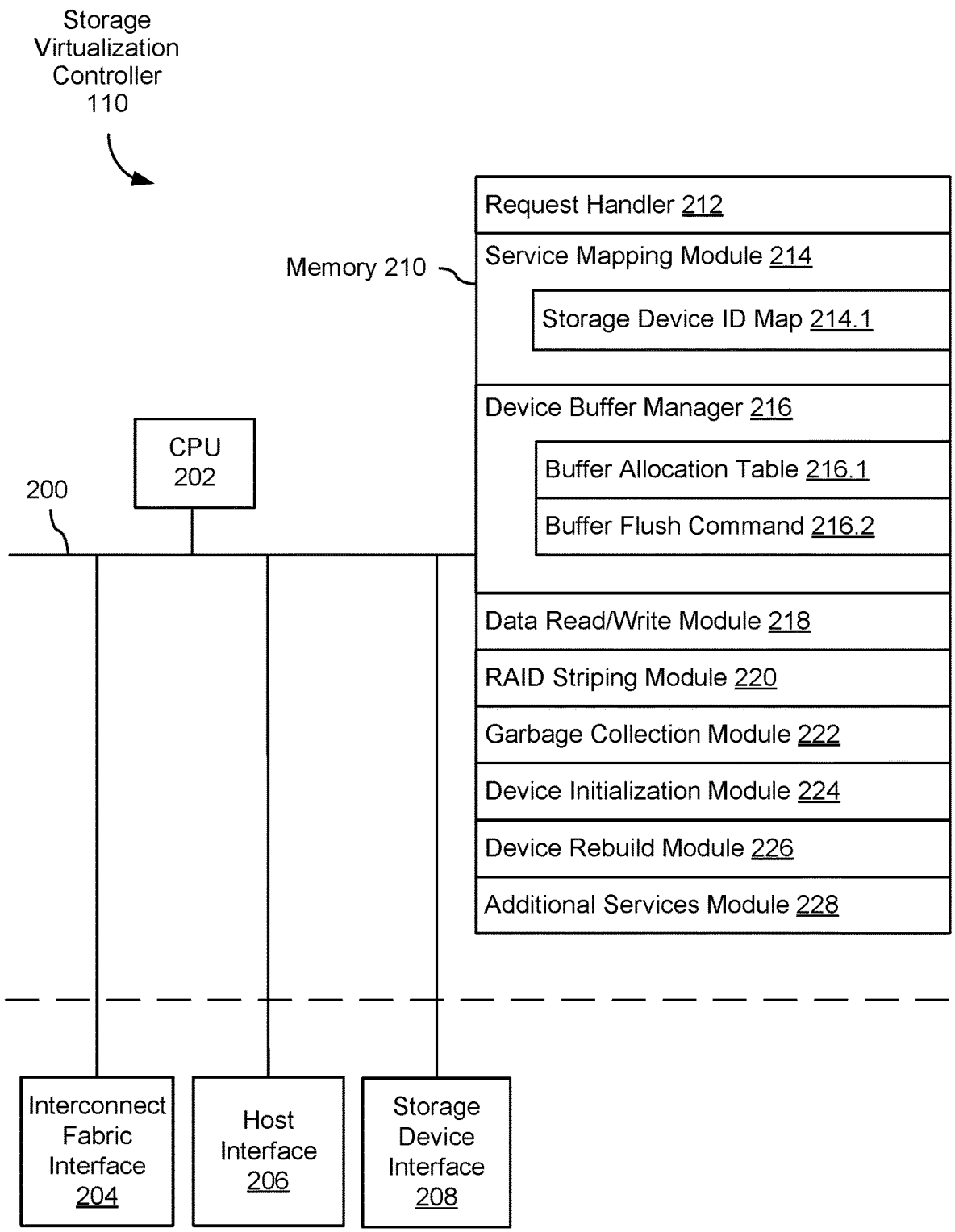
FIG. 2 schematically illustrates an example of a storage virtualization controller of the multi-device storage system of FIG. 1.

FIG. 2 is a block diagram illustrating an example storage virtualization controller (SVC) 110, in accordance with some embodiments, as shown in FIG. 1. A host may access storage in a storage system by sending read/write commands to SVC 110. In some embodiments, SVC 110 may be a control path only component and not in the data path. Data associated with read/write commands is transferred between storage devices and host systems or from storage device to storage device without passing through SVC 110. For example, SVC 110 may communicate (directly or indirectly) with remote data management system (RDMS) engines in the hosts, storage devices, interconnect fabric, network interfaces, etc. to establish data transfers from one component to another without routing through SVC 110.

In some embodiments, SVC 110 controls data flow between hosts and storage devices. SVC 110 may receive commands from the host, calls storage device distributed services (e.g. host flash translation layer (FTL) services), receives status from storage devices, and provides status back to the host. In some embodiments, SVC 110 may include hardware automation to handle specific performance cases. SVC 110 may implement storage system level management of storage device resources across all storage devices in the storage array, such as allocation of media storage space, distributes services, and related processor and memory resources, including storage device buffer memory. For example, SVC 110 may manage storage device buffer memory and assign them for read/write, garbage collection operations, degraded operations, and rebuild operations. In some embodiments, SVC 110 may manage storage system level operations by calling distributed and/or offloaded services, such as host FTL services, executed by one or more storage devices.

SVC 110 typically includes one or more processing units (CPUs 202), sometimes herein called CPUs, processors, or hardware processors, and sometimes implemented using microprocessors, microcontrollers, or the like, for executing modules, programs, and/or instructions stored in memory 210 and thereby performing processing operations, memory 210 (sometimes called storage virtualization controller memory), and one or more communication buses 200 for interconnecting these components. The one or more communication buses 200 optionally include circuitry (sometimes called a chipset) that interconnects and controls communications between system components.

SVC 110 may be coupled to one or more hosts (e.g. host 102 in FIG. 1) by host interface 206 via a network fabric (e.g. network fabric 104 in FIG. 1) and is coupled to storage device(s) (e.g. storage devices 120 in FIG. 1) by storage device interface 208 via an interconnect fabric (e.g. interconnect fabric 114 in FIG. 1) through an interconnect fabric interface 204. In some embodiments, all communications from SVC 110 may pass through an interconnect fabric via an interconnect fabric interface 204, including host communications and storage device communications, and host communications may by routed through a storage network interface (e.g. interface 112 in FIG. 1) connected to the interconnect fabric.

Memory 210 may include high-speed random access memory, such as DRAM, SRAM, double data rate (DDR) RAM, or other random access solid state memory devices, and may include non-volatile memory, such as one or more magnetic disk storage devices, optical disk storage devices, flash memory devices, or other non-volatile solid state storage devices. Memory 210 may optionally include one or more storage devices remotely located from CPU(s) 202. Memory 210, or alternatively the non-volatile memory device(s) within memory 210, comprises a non-transitory computer readable storage medium.

In some embodiments, memory 210, or the non-transitory computer readable storage medium of memory 210 stores the following programs, modules, and data structures, or a subset or superset thereof:

request handler 212 for receiving and managing requests from other systems or subsystems, such as read/write requests from a host;

service mapping module 214 for managing the location of distributed and/or offloaded services among the storage devices in the array;

device buffer manager 216 for managing buffer resources among the storage devices in the array;

data read/write module 218 for managing read operations between the host and storage devices;

RAID striping module 220 for managing the RAID striping across the storage devices in the array;

garbage collection module 222 for managing garbage collection across the storage devices in the array;

device initialization module 224 for initializing or restarting one or more storage devices in the array after a power failure or other interruption;

device rebuild module 226 for managing the rebuild of a failed storage device, including distributed services and memory resources; and additional services module 228.

Each of the above identified elements of SVC 110 may be stored in one or more of the previously mentioned memory devices and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 210 may store a subset of the modules and data structures identified above. Furthermore, memory 210 may store additional modules and data structures not described above. In some embodiments, the programs, modules, and data structures stored in memory 210, or the non-transitory computer readable storage medium of memory 210, provide instructions for implementing some of the methods described below. In some embodiments, some or all of these modules may be implemented with specialized hardware circuits that subsume part or all of the module functionality.

In some embodiments, request handler 212 may be configured to receive commands from a host (e.g. host 102 in FIG. 1) via host interface 206, such as host read commands and host write commands. In some embodiments, request handler 212 may receive other commands via request handler 212, such as data erase commands and/or commands related to garbage collection, data recovery, and other functions. Request handler 212 may receive commands from systems or subsystems other than the host, such as one or more of the storage devices in the array. In some embodiments, request handler 212 may receive data management related requests from data management services hosted in other systems or subsystems, including other components of SVC 110. For example, garbage collection module 222, device initialization module 224, and/or device rebuild module 226 may initiate data management operations based on user input, system events, scheduled maintenance, and/or other triggers. These modules may send a request to request handler 212 for accessing hosted services on one or more storage devices 120.

In some embodiments, request handler 212 may receive a read command from the host. For example, the read command may identify a range of host logical block addresses (host LBAs) stored in the storage devices 120 of data storage system 100 from which the host requests data to be transferred to a host data location, such as a read buffer in host 102. Request handler 212 may receive a write command from the host. For example, the write command may identify a write data location, amount of data to be written, and a range of host LBAs to which the data should be written. In some embodiments, write commands may be received corresponding to a defined page size that aligns with media programming sizes, such as 4 KB pages.

In some embodiments, service mapping module 214 may include one or more tables or functions for identifying one or more offloaded or distributed services in storage devices 120. For example, service mapping module 214 may identify one or more of storage devices 120 hosting data management operations, such as host FTL lookup, host FTL updates, parity host FTL updates, host FTL initialization, host FTL rebuild, buffer-to-buffer copy, buffer-to-buffer coding, storage device log access, and/or garbage collection support like LBA log filtering or data movement. In some embodiments, service mapping module 214 may include a storage device identifier (ID) map 214.1 (also referred to as a device virtualization table) to identify which of storage devices 120 host the needed service for a given command or data management function. For example, in response to receiving a host read/write request, SVC 110 may need to access host LBA to storage device storage location mapping information using a host FTL lookup operation.

In some embodiments, SVC 110 may not contain any host LBA to storage device storage location mapping information, but service mapping module 214 may provide a function for determining which of storage devices 120 does. For example, host FTL mapping information for the storage array may be distributed across multiple storage devices and service mapping module 214 may access storage device ID map 214.1 to identify which of storage devices 120 hosts the relevant portion of the host FTL mapping information. In some embodiments, a fixed function or calculation, such as modulo math may be used by service mapping module 214 to determine the storage device ID of the storage device with services relevant to the command being processed. The storage device ID may be used by SVC 110 to communicate with and control the offloaded or distributed services in storage devices 120. The storage device containing the relevant host FTL services and identified by the storage device ID may be referred to as a service host or the target service host storage device for any give service request.

In some embodiments, device buffer manager 216 may enable SVC 110 to utilize persistent memory, such as NVM controller memory buffers, across storage devices 120 to manage host data transfers and other data management functions. For example, each of storage devices 120 may include a plurality of memory devices addressable through remote direct memory access (RDMA) and device buffer manager 216 may allocate buffer space for host data transfers and other data management functions.

In some embodiments, device buffer manager 216 may include a buffer allocation table 216.1 for managing buffer use among storage devices 120. For example, as host write requests are processed, buffer manager 216 provides logic for determining how host data is serialized across the buffers in different storage devices 120 based on current and/or prior use data in buffer allocation table 216.1. Algorithms used by buffer manager 216 may implement RAID configurations, load balancing, allocation of storage capacity, input/output (I/O) efficiency, and data reliability considerations to order buffer use. In some embodiments, buffer manager 216 may also be used for buffer allocation for garbage collection, data rebuild, and/or other functions.

Device buffer manager 216 may identify buffer locations in storage devices 120 and issue buffer access commands to one or more RDMA engines to initiate data transfers. In some embodiments, device buffer manager 216 maintains a log of buffer allocations across storage devices 120, such as in buffer allocation table 216.1, and issues status notifications to storage devices 120 regarding which buffers are allocated to specific host FTL services and which buffers are available to storage devices 120 for local use. In some embodiments, device buffer manager 216 may issue buffer commands to storage devices 120 to manage buffer use by SVC 110, data management operations, distributed services, and/or use by peer storage devices.

In some embodiments, device buffer manager 216 may allocate buffer memory for a series of smaller host reads or host writes (e.g. 4K block writes) in order to fill a buffer space corresponding to a preferred granularity of a destination storage device, such as 96K or 192K multiplane pages. For example, allocated host writes may be serialized or otherwise allocated until the buffer space is full and then written to the storage medium/media from the buffer space. In some embodiments, device buffer manager 216 may include a buffer flush command 216.2. Buffer flush command 216.2 may be sent to one or more of storage devices 120 to have the target storage device write the contents of one or more buffers to medium/media and clear those buffers for subsequent use.

In some embodiments, data read/write module 218 may execute a series of operations to coordinate the execution of a host read command or host write command between storage devices 120 and host 102. When a host read or write command is received by request handler 212, it may initiate data read/write module 218. Data read/write module 218 may use service mapping module 214 to identify a storage device ID based on the host LBA identified in the host read/write command. For example, data read/write module may use an FTL lookup command to access the FTL lookup operation hosted by the target service host storage device. SVC 110 may receive a response from the target host storage device identifying the storage device ID and storage device storage location for the destination storage device with the requested data in the host read/write command.

Data read/write module 218 may use device buffer manager 216 to request a buffer allocation in one or more destination storage devices and use one or more read or write commands to initiate data transfers among the medium or media of the destination storage device, allocated buffer space, and a host data location. For example, a buffer access command may be sent to an RDMA engine capable of pushing (and/or pulling) the read data in the allocated buffer space to the host address included in the host read command. An RDMA engine in the destination storage device, the host, or elsewhere in the communication fabric and interfaces, such as a network interface card, may initiate the data transfer between the buffer in the storage device and the host.

For host write operations, an FTL update command may be sent by SVC 110 to the target service host storage device using the storage device ID. Note that the storage device hosting the relevant portion of the host LBA mapping may not be the same as the destination storage device for the write command, so the target service host storage device for FTL update command may be different than the destination storage device ID. SVC 110 may receive a response from the target host storage device when the relevant portion of the distributed FTL map has been updated.

When the data transfer between the destination storage device and the host is complete and the FTL map has been updated (if needed), SVC 110 may send a read or write complete status to the host. In some embodiments implementing RAID or parity error coding, the distributed services for updating the FTL map may also implement drive-to-drive RAID and/or parity data transfers and related FTL map updates.

In some embodiments, SVC 110 may coordinate RAID striping among storage devices 120 based on a selected RAID configuration. For example, RAID striping module 220 may support write serialization and the use of device buffer manager 216 to allocate writes in RAID stripes. RAID striping module 220 may commit each portion of a RAID stripe to storage devices 120. In some embodiments, when an entire stripe has been written, buffer flush command may be used to write the entire stripe from their respective buffers to the storage medium or media.

In an example RAID configuration, there may be one or more RAID groups in the storage system and any given storage device may participate in one or more RAID groups. The storage device FTL of individual storage devices may not implement RAID across storage media within the storage device, even if the storage device includes multiple discrete media units, such as NVM dies or packages. In some embodiments, the RAID stripes are across storage device storage locations (e.g. storage device LBAs) from different storage devices with a stripe depth equal to the device storage location granularity or storage unit sizes, such as a multi-plane programming size. For example, no two pages in a RAID stripe may be on the same media unit and no two pages in the RAID stripe may be in the same storage device. In a multi-plane programming implementation, the RAID stripe may initially be built across buffers from different storage devices such that each buffer maps exactly over a page corresponding to the multi-plane programming.

In some embodiments, parity computation is accomplished by moving data from the buffer of the destination storage device to a parity storage device using an RDMA engine for a buffer-to-buffer transfer. When the data is moved to the parity storage device, a new parity is calculated as a function of current parity and the new data, and the new parity is put back in the buffer of the parity device. In some embodiments, this may be accomplished in one atomic RDMA operation between the two storage devices without any intervention from SVC 110.

In some embodiments, SVC 110 may coordinate garbage collection among storage devices 120 using garbage collection module 222. If data is written to a storage medium in pages, but the storage medium is erased in blocks, pages in the storage medium may contain invalid (e.g., stale) data, but those pages may not be able to be overwritten until the whole block containing those pages is erased. In order to write to the pages with invalid data, the pages (if any) with valid data in that block may be read and re-written to a new block and the old block is erased (or put on a queue for erasing). This process is called garbage collection. After garbage collection, the new block contains the pages with valid data and may have free pages that are available for new data to be written, and the old block can be erased so as to be available for new data to be written. A variety of garbage collection algorithms may be used for selecting blocks to be moved.

In some embodiments, garbage collection module 222 may perform garbage collection operations using one or more buffer memories and/or processing capacity among storage devices 120. For example, garbage collection module 222 may use an LBA filtering command to identify specific blocks of memory on storage devices 120 as candidates for garbage collection or other data management operations. Garbage collection module 222 may use a data move command to move blocks identified for rewriting by the garbage collection algorithm it implements. In some embodiments, garbage collection module 222 may also collect and track usage information for storage devices 120.

In some embodiments, SVC 110 may coordinate initialization of storage devices 120 using device initialization module 224. For example, after a service interruption for one or more storage devices 120, each affected storage device may need to be initialized. Service interruptions may include power interruption to the system and/or individual storage devices, loss of communication among one or more systems or subsystems, device failure and replacement, etc. Device initialization module 224 may be responsible for coordinating among the storage devices being initialized to assure that data, including storage media data, buffer data, and logical mapping data, are consistent across storage devices and that ending interrupted operations or queues of pending operations are not lost. Where appropriate, operations may be restarted and/or data may be mirrored from another memory location, in some cases from a peer storage device, to return the array to a consistent state.

In some embodiments, device initialization module 224 may use a host FTL initialization command to one or more effected storage devices for an initialization operation. For example, the host FTL initialization command may initialize a segment of the host FTL mapping table hosted by the service host storage device. The command may instruct the storage device to process a series of log entries to update the host FTL mapping table.

In some embodiments, SVC 110 may coordinate rebuild of failed storage devices within the array using device rebuild module 226. For example, when a storage device within a RAID group fails and cannot be recovered, the storage device may be replaced and rebuilt or rebuilt to one or more other storage devices, such as a hot spare available to the array. Device rebuild may include both rebuilding RAID data stripes according to the RAID configuration and mirrored data and/or parity data available on remaining storage devices in the array and rebuilding distributed services and related data.

In some embodiments, portions of the host FTL mapping table that were hosted on the failed storage device may be rebuilt to a new storage device or storage location on an existing storage device. In some embodiments, the host FTL mapping table may have its own RAID configuration and parity data distributed among the storage devices. Rebuilding one or more portions of a host FTL mapping table for a missing or failed device may include sending a host FTL rebuild command to each remaining storage device containing relevant host FTL mapping data and/or host FTL mapping parity data for the missing portions. For example, the rebuilt portion of the host FTL mapping table may be returned from the storage device to SVC 110 and then sent to the new storage location or the rebuilt portion may be sent directly to the rebuilt storage device or new storage location through a peer-to-peer transfer.

In some embodiments, SVC 110 may include any number of additional services modules (e.g. additional services module 228) corresponding to additional data management services or operations. The example data management services shown in SVC 110 may not be exhaustive of data management services or operations that may be distributed among peer storage devices and benefit from SVC 110 or another component providing some level of coordination among the storage devices.

Although FIG. 2 shows SVC 110 as an architecturally isolated storage controller, FIG. 2 is intended more as functional description of the various features which may be present in a management module than as a structural schematic of the embodiments described herein. In practice, and as recognized by those of ordinary skill in the art, items shown separately could be combined and some items could be separated. In some embodiments, one or more of the operations and/or modules of SVC 110 may instead be performed and/or implemented by other components in data storage system 100. In some embodiments, one or more of the operations and/or modules of SVC 110 may instead be performed and/or implemented by one or more NVM controllers 130. For example, NVM controller 130 of storage device 120.1 may include data management logic (e.g., similar to one or more modules in memory 210 of FIG. 2) for managing the data lifetime of memory blocks of one or more of the storage devices 120.1 through 120.n. In some embodiments, the modules in memory 210 may be implemented in whole or in part by software, hardware, firmware, or any combination thereof in data storage system 100.

In some embodiments, SVC 110 may be implemented by a host system (e.g., host 102, FIG. 1) that also stores and accesses data in the plurality of storage devices 120. Furthermore, in some embodiments, SVC 110 may be implemented by a storage device (e.g., storage device 120.1, FIG. 1) in the multi-device storage environment. Still further, in some embodiments, SVC 110 may be implemented elsewhere in the communication fabric and interfaces of data storage system 100. For example, SVC 110 may be implemented as part of interconnect fabric 114, interface 112, or the host-side network fabric 104.

Figure 3:
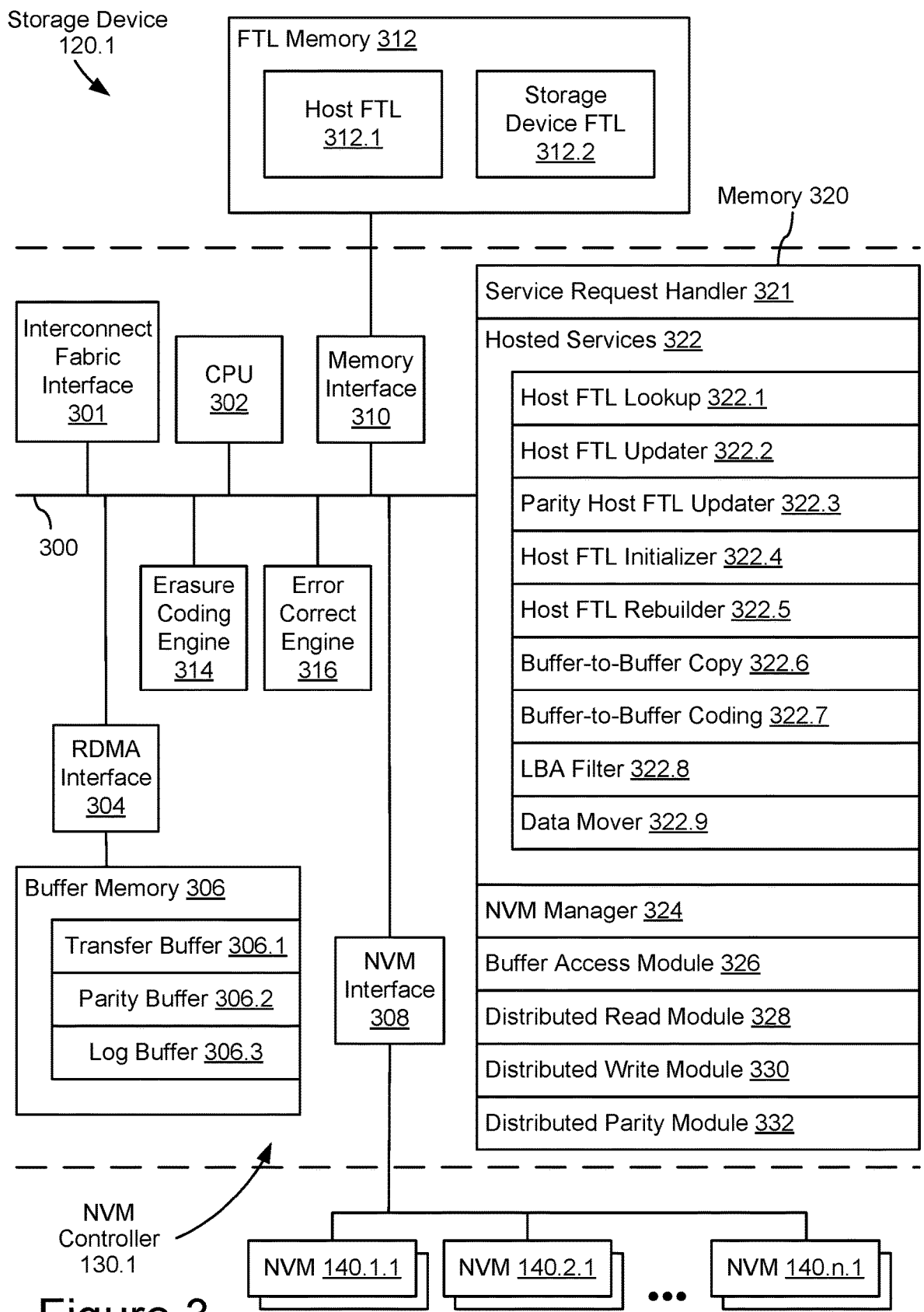
FIG. 3 schematically illustrates an example of a storage device of the multi-device storage system of FIG. 1.

In some embodiments, as shown in FIG. 3, a storage device 120.1 includes the functions of an NVM controller 130.1 and distributed hosted services 322 using common compute resources, such as one or more processing units (CPUs 302), sometimes herein called CPU, processors, or hardware processors, and sometimes implemented using microprocessors, microcontrollers, or the like, configured to execute instructions in one or more programs (e.g., the modules in memory 320). In some embodiments, the one or more CPUs 302 are shared by one or more components within, and in some cases, beyond the function of storage device 120. The modules in memory 320 and executed by CPU 302 may be coupled to interconnect fabric interface 301, RDMA interface 304, NVM interface 308, memory interface 310, and any number of additional modules, such as erasure coding engine 314 and error correction engine 316, in order to coordinate the operation of these components. In some embodiments, the components of storage device 120.1 may be interconnected by one or more communication buses 300. In some embodiments, CPU 302, memory 320, NVM interface 308, and any number of additional modules may be packaged as an NVM controller 130.1 implemented in an application-specific integrated circuit (ASIC), field programmable gate array (FPGA), or similar architecture.

Storage device 120.1 may include a variety of local memory resources and local compute resources. In some embodiments, local resources may include components that are integrated into storage device 120.1 and may scale with the number of storage devices. Example local memory resources may include memory 320 (e.g. the operating memory of NVM controller 130.1), buffer memory 306 (e.g. remotely addressable memory available through a remotely addressable interface), and FTL memory 312 (a specialized memory component accessible to NVM controller 130.1 but not necessarily sharing the same bus, board, or package). In some embodiments, a storage medium or media, such as NVM devices 140, may provide local memory resources for data management functions, but these may be distinct from storage locations for host data. Example local compute resources may include CPU 302 (e.g. the operating processor of NVM controller 130.1), erasure coding engine 314, error correction engine 316, and any other specialized processing systems. In some embodiments, one or more interfaces, such as interconnect fabric interface 301 or RDMA interface 304, may also include or utilize memory and/or compute resources and may be part of the available local resources of storage device 120.1.

In some embodiments, RDMA interface 304 may be a hardware, software, or combined hardware/software engine for providing remote data management access to buffer memory 306. This may include local direct memory access (DMA) to buffer memory 306 for CPU 302 or other components of NVM controller 130.1. The RDMA engines of RDMA interface 304 may allow storage device 120.1 to push or pull data from/to buffer memory 306 and to/from memory locations in other storage devices, storage controllers (e.g. SVC 110), or servers (e.g. host 102).

In some embodiments, erasure coding engine 314 may be a hardware, software, or combined hardware/software engine for providing exclusive-or calculations or implementing another erasure coding operation. Erasure coding engine 314 may support multiple functions stored in memory 320 and/or support XOR or other erasure code processing of data being transferred to or from buffer memory 306, with or without RDMA interface 304, and/or FTL memory 312.

In some embodiments, error correction engine 316 may be a hardware, software, or combined hardware/software engine for providing error control for data written to and read from NVM devices 140. For example, error correction engine 316 may include an error control module to limit the number of uncorrectable errors inadvertently introduced into data during writes to memory and/or reads from memory, such as an error correction code (ECC) encoder and decoder.

Additional modules (not shown) supporting one or more functions of storage device 120 may be connected to CPU 302, RDMA interface 304, NVM interface 308, erasure coding engine 314, FTL memory 312, and memory 320. In some embodiments, additional module(s) are executed in software by the CPU 302; in other embodiments, additional module(s) are implemented in whole or in part using special purpose circuitry (e.g., to perform encoding and decoding functions).

In some embodiments, during a write operation initiated by a host 102, SVC 110 receives a host write command (e.g., in a set of one or more host write commands) via interface 112 (FIG. 1), translates that host write command into a write command, sometimes called a translated command or translated write command, suitable for execution by a data storage device 120, and sends the translated command to one or more data storage devices corresponding to one more addresses specified by the host write command, a destination storage device.

In some storage systems, a storage controller also receives, via interface 112, data to be stored in the one or more data storage devices corresponding to the one more addresses specified by the host write command. A respective data storage device receives the data to be stored in its NVM devices 140.1.1-140.1.n, or a portion of the data to be stored, from the storage controller via the interconnect fabric 114. The data received by the storage device may be encoded or otherwise processed and made available to storage NVM interface 308, which transfers the data to NVM devices 140.1 in a manner dependent on the type of storage medium being utilized. In storage device 120, RDMA interface 304 and buffer memory 306, in conjunction with coordination from SVC 110, may allow host 102 to send the data to be stored in the host write command to buffer memory 306 in storage device 120 without them passing through SVC 110 or another storage controller.

In some embodiments, a read operation is initiated when host 102 sends a host read command (e.g., in a set of one or more host read commands), to SVC 110, which translates the received host read command into a read command (e.g., into a lower level data storage device command, sometimes herein called a translated command or translated read command, suitable for execution by a data storage device 120) and sends the translated read command to a destination data storage device 120, requesting data from that data storage device's storage medium (e.g., one or more NVM devices 140.1). CPU 302 may send one or more read access commands to NVM devices 140.1, via NVM interface 308, in accordance with memory locations (addresses) specified by the host read command.

NVM interface 308 may provide the raw read data (e.g., comprising one or more codewords) for decoding or other processing. The read access commands correspond to the received read command, but the read command is converted by storage device 120 into read access commands, for example so as to be directed to one or more specific NVM device from NVM devices 140.1. In some embodiments, if the read is not successful, storage device 120 may resort to a number of remedial actions or provide an indication of an irresolvable error condition.

In some storage systems, the read data from storage device 120 is provided to a storage controller to make it available to host 102. In storage device 120, RDMA interface 304 and buffer memory 306, in conjunction with coordination from SVC 110, may allow host 102 to receive the data to be read in the host read command from buffer memory 306 in storage device 120 without them passing through SVC 110 or another storage controller.

As explained above, a storage medium or media (e.g., NVM devices 140.1) is divided into a number of addressable and individually selectable blocks and each block is optionally (but typically) further divided into a plurality of pages and/or word lines and/or sectors, storage locations of defined storage unit sizes. While erasure of data from a storage medium is performed on a block basis, in many embodiments, reading and programming of the storage medium is performed on a smaller subunit of a block (e.g., on a page basis, word line basis, or sector basis).

In some embodiments, the smaller subunit of a block consists of multiple memory cells (e.g., single-level cells (SLCs) or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called the fast page), and (2) an upper page (sometimes called the slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell. In some embodiments, the encoding format of the storage medium or media (i.e., TLC, MLC, or SLC and/or a chosen data redundancy mechanism or ECC code) is a choice made when data is actually written to the storage medium or media.

FIG. 3 is a block diagram illustrating distributed data management and read/write operations handled by storage device 120, in accordance with some embodiments. Storage device 120 includes CPU 302 for executing modules, programs, and/or instructions stored in memory 320 and thereby performing processing operations, memory 320 (sometimes called NVM controller memory or operating memory), and one or more communication buses 300 for interconnecting these components.

The one or more communication buses 300 optionally include circuitry (sometimes called a chipset) that interconnects and controls communications between system components. CPU 302 and memory 320 may be coupled to interconnect fabric interface 301, RDMA interface 304, buffer memory 306, NVM interface 308, NVM devices 140.1, memory interface 310, FTL memory 312, erasure coding engine 314, error correction engine 316, and any additional module(s) by the one or more communication buses 300. In some embodiments, interface hardware and/or protocols for providing communication through communication buses 300 may also be present for communication with any given component. For example, FTL memory 312 may be provided in RAM external to an FPGA, ASIC, or other architecture integrating CPU 302, memory 320, and other components in FIG. 3 and memory interface 310 may be provided for CPU 302 to transfer data to and from FTL memory 312.

Memory 320 may include high-speed random access memory, such as DRAM, SRAM, DDR RAM, or other random access solid state memory devices, and may include non-volatile memory, such as one or more magnetic disk storage devices, optical disk storage devices, flash memory devices, or other non-volatile solid state storage devices. Memory 320 may optionally include one or more storage devices remotely located from CPU 302. In some embodiments, one or more additional memories may be provided for specific functions, such as FTL memory 312 for flash translation layer (FTL) data, and/or buffer memory 306. These functional memories may include specialized processing, hardware acceleration, and/or other resources related to their function. In some embodiments, one or more of FTL memory 312 and/or buffer memory 306 may be part of memory 320.

Memory 320, or alternatively the non-volatile memory device(s) within memory 320, comprises a non-transitory computer readable storage medium. In some embodiments, memory 320, or the non-transitory computer readable storage medium of memory 320 stores the following programs, modules, and data structures, or a subset or superset thereof:

service request handler 321 for receiving and managing requests from other systems or subsystems, such as SVC 110 or peer storage devices hosted services 322 for managing distributed data management operations (including logical address mapping) and related processes and requests, such as host FTL lookup requests from a host, storage controller, or another storage device (e.g., host 102, SVC 110, or storage devices 120);

NVM manager 324 for managing storage device FTL data (including logical address mapping) and related processes and requests, such as media read and write operations through NVM interface 308 to NVM 140.1.1-140.1.n;

buffer access module 326 for monitoring contents and access to buffer memory 306, sometimes referred to as persistent memory buffers or controller memory buffers, by storage device 120, as well as hosts, storage controllers, and peer storage devices (e.g., host 102, SVC 110, or storage devices 120);

distributed read module 328 for executing read operations as a destination storage device, in conjunction with NVM manager 324 and buffer access module 326;

distributed write module 330 for executing write operations as a destination storage device, in conjunction with NVM manager 324 and buffer access module 326; and distributed parity module 332 for executing parity writes and related processes for calculating parity and related host FTL updates, in conjunction with erasure coding engine 314, NVM manager 324, and buffer access module 326.

Each of the above identified elements may be stored in one or more of the previously mentioned memory devices that together form memory 320 and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 320 may store a subset of the modules and data structures identified above. Furthermore, memory 320 may store additional modules and data structures not described above. In some embodiments, the programs, modules, and data structures stored in memory 320, or the non-transitory computer readable storage medium of memory 320, provide instructions for implementing respective operations of the methods described below. In some embodiments, some or all of these modules may be implemented with specialized hardware circuits that subsume part or all of the module functionality.

In some embodiments, service request handler 321 may include an addressable communication channel for receiving messages from other systems or subsystems, such as hosts, storage controllers, and peer storage devices (e.g., host 102, SVC 110, or storage devices 120). In some embodiments, request handler 212 may receive a data management commands or requests that can be executed by the memory and compute resources of storage device 120.1, alone or in conjunction with peer storage devices and/or SVC 110. For example, service request handler 321 may receive host FTL lookup requests, host FTL update requests, parity host FTL update requests, host FTL initialization requests, host FTL rebuild requests, buffer access requests, buffer-to-buffer copy requests, buffer-to-buffer coding requests, log read requests, log processing requests, LBA filter requests, data move requests, etc. Service request handler 321 may parse the received requests and initiate, continue, or stop hosted services. In some embodiments, service request handler 321 may initiate read, write, and parity operations based on corresponding requests, which may or may not utilize one or more hosted services 322.

In some embodiments, hosted services 322 may include portions of FTL services that may have otherwise been executed at the storage controller or host, such as access to and maintenance of host FTL logical map 312.1 stored in FTL memory 312. For example, host FTL logical map 312.1 may include a portion of a complete logical map for all storage devices in data storage system 100. In some embodiments, the complete logical map is allocated in portions distributed across storage devices 120 in approximately equal portions. The host FTL logical map 312.1 on any given storage device 120 may or may not include storage locations on that storage device 120. In some embodiments, portions of the complete logical map may be allocated randomly, sequentially in a round robin fashion, or according to a more determined allocation scheme to support data protection, performance, or capacity utilization standards of service. In some embodiments, each portion of the complete logical map is redundantly stored across two or more storage devices in case of storage device failure.

In some embodiments, host FTL logical map 312.1 may be hosted in a dedicated portion of FTL memory 312. For example, FTL memory 312 may be DRAM with a portion dedicated to storage device FTL map 312.2 and the remainder dedicated to host FTL logical map 312.1. Host FTL logical map 312.1 may be used for holding segments of mapping information between Host logical block addresses (LBA) and storage device LBA or media storage locations. In some embodiments, the complete logical map for all host LBAs in data storage system 100 may be contained in a host FTL table and host FTL logical map 312.1 in any given storage device 120 may be a mathematically determined portion of the host FTL table to enable a host FTL lookup request to be addressed to the correct target service host storage device. For example, hosted services 322 in storage device 120 may be responsible for host LBAs 1-1000, regardless of which of storage devices 120.1-120.n host the actual data on their medium or media, and host FTL lookup requests for those LBAs will be addressed to hosted services 322.

In some embodiments, host FTL logical map 312.1 may be allocated and/or organized by host LBA storage locations corresponding to a host write size, such as 4K data blocks. Storage device FTL map 312.2 may be allocated and/or organized by media LBA storage locations corresponding to a media write or programming size that is a larger multiple of the host write size. For example, the media programming size may be set to a page programming size, such as a multiplane page size of 96K or 192K. Thus, the host block size may be smaller than the media block size by a factor of 6, 12, 24, 48 or more, depending on the relationship between the host write granularity and the page programming granularity.

By increasing the media write granularity, storage device FTL map 312.2 may use less of FTL memory 312. For example, storage device FTL map 312.2 may use less than 5% of FTL memory 312 relative to the remaining memory space available for host FTL logical map 312.1. In some embodiments, this may enable storage devices that are switchable between conventional host data block mapping (e.g. 4K host writes to storage media locations) and off-loaded host FTL with reduced memory for storage device FTL at higher media write granularity (e.g. 96K or 192K media writes) without changing FTL memory 312 hardware.

In some embodiments, storage device FTL map 312.2 may be configured for continuous logical block sizes corresponding to the media programming size. Each storage media block may be presented and managed without regard to bad blocks, media flaws or wear, or discontinuous physical media locations. For example, NVM manager 324 may manage the storage device FTL such that continuous logical blocks of the media programming size are provided for use in allocating media storage locations in storage device FTL map 312.2.

Hosted services 322 may include a number of services or functions for supporting distributed read/write operations, drive-to-drive operations, and other data management operations. In some embodiments, hosted services 322 may include services related to initializing, accessing, updating, and using host FTL logical map 312.1, supporting distributed read/write operations using buffer memory 306 and erasure coding engine 314, distributed garbage collection services, maintenance and use of log data for continuity, peer drive communication, and/or storage device rebuild (RAID rebuild of host data and/or host FTL mapping information). Each of these service operations may utilize local memory and compute resources.

Hosted services 322 may include host FTL lookup 322.1 for looking up mapping information to translate host LBA to media storage locations or vice versa. For example, service request handler 321 may receive a host FTL lookup request indicating one or more host LBAs, lookup the corresponding entries in host FTL logical map 312.1, and return mapping information corresponding to the media storage locations on the respective storage devices. The returned mapping information may include both one or more storage device identifiers and corresponding storage device LBA or media storage location identifiers for use by other centralized (SVC 110 or host 102) or distributed (other storage devices) functions, such as read/write, garbage collection, parity calculation, RAID striping, data recovery, data or FTL map rebuilding, etc.

Hosted services 322 may include host FTL updater 322.2 for updating the portion of the host FTL logical map 312.1 in FTL memory 312. Service request handler 321 may receive a host FTL update request specifying one or more host LBAs and the new mapping information for the corresponding storage device identification and media storage locations. In some embodiments, host FTL updater 322.2 writes the new mapping information to host FTL logical map 312.1.

In embodiments using redundant host FTL mapping, host FTL updater 322.2 may also send the new mapping information to the corresponding portion of host FTL logical map in another storage device. For example, host FTL updater 322.2 may write the new mapping information be sending an update request to the host FTL updater of another storage device. In some embodiments, host FTL updater 322.2 may also log the changes in buffer memory 306 and/or corresponding buffers in the redundant storage device. Host FTL updater 322.2 may send an update complete message to the requester.

In some embodiments, the update request will include updating both host FTL mapping information for the destination storage device and for a parity storage device. Host FTL updater 322.2 may receive a host FTL update command with host LBA, mapping information, and parity storage device identifier. Host FTL updater 322.2 may look up the stored mapping information in FTL logical map 312.1 and XOR the stored mapping information with received mapping information, then send a host FTL XOR update command to the host FTL services of the parity storage device. In some embodiments, host FTL updater 322.2 may receive status or other notification that the host FTL XOR update command is complete and update the local host FTL logical map 312.1 with the new mapping information. In some embodiments, host FTL updater may log the change to the host FTL entry in host FTL logical map 312.1 in a buffer log 306.3 in buffer memory 306.

In some embodiments, storage device 120 also acts as a parity storage device and hosted services 322 may include parity host FTL updater 322.3. Parity host updater 322.2 may receive a host FTL XOR update command from the host FTL services of another storage device, such as the storage device maintaining the relevant portion of host FTL logical map 312.1. Parity host FTL updater 322.3 may issue commands to access the local data identified in the request, XOR that data with the contents of a XOR buffer (e.g. parity buffer 306.2 in buffer memory 306) identified in the request, and write the resulting data into the same XOR buffer.

In some embodiments, parity host FTL updater 322.3 may process a similar operation on the mapping information in the request: retrieve the corresponding mapping information (host FTL entry corresponding to parity LBA); XOR the mapping information in the request with the retrieved mapping information; and store the results back in (local) host FTL logical map 312.1. In some embodiments, parity host FTL updater 322.3 may log the change to the host FTL entry in host FTL logical map 312.1 in a log in buffer memory 306. Parity host FTL updater 322.2 may send a status back to service request handler 321 of the storage device that sent the request.

Hosted services 322 may include host FTL initializer 322.4 for initializing a portion of the host FTL logical map 312.1 in FTL memory 312 after a power on or other initialization event. In some embodiments, initialization may include replaying a series of host FTL updates from a log stored in persistent memory. For example, host FTL initializer 322.4 may use a log buffer 306.3 allocated in buffer memory 306. Service request handler 321 may receive a host FTL initialize request defining the host LBA mapping information to be initialized in FTL logical map 312.1. For example, the request may specify one or more persistent memory locations containing updated host FTL mapping information, such as by providing a starting position and number of log entries to be processed. Host FTL initializer 322.4 may parse each log entry into an LBA field and the corresponding mapping information. Host FTL initializer 322.4 may compute the memory location for the corresponding entry in host FTL map 312.1 and update host FTL map 312.1 based on the mapping information from log buffer 306.3. Service request handler 321 may return a complete status message to the requester, such as SVC 110, when the specified log entries have been processed.

Hosted services 322 may include host FTL rebuilder 322.5 for rebuilding a portion of the host FTL logical map 312.1 that is stored in a peer storage device that is missing or has failed. In some embodiments, mirrored portions and/or parity information may be distributed among peer storage devices and rebuild requests may be sent to each of the remaining storage devices for the host FTL rebuild. Service request handler 321 may receive a host FTL rebuild request defining the list of FTL mapping entries in the receiving storage device that correspond to the host FTL segments in the missing or failed storage device. For example, host FTL rebuilder 322.5 may recreate the missing entry by XORing the corresponding entries in host FTL logical map 312.1. In some embodiments, the corresponding entries are distributed across multiple surviving storage devices and drive-to-drive communication may be used to complete the rebuild, such as buffer-to-buffer copy 322.6 and/or buffer-to-buffer coding 322.7.

Hosted services 322 may include buffer-to-buffer copy 322.6 and buffer-to-buffer coding 322.7 to enable drive-to-drive communication and data management functions. These services may be requested specifically through buffer-to-buffer copy requests to service request handler 321 and/or may be integrated into other services, such as distributed parity module 332 or host FTL rebuilder 322.5. In some embodiments, buffer-to-buffer copy 322.6 moves data from one buffer location in buffer memory 306 in a first storage device to a second buffer location in buffer memory 306 of another storage device. For example, a buffer-to-buffer copy request may specify the source and destination storage device IDs, corresponding buffer memory locations, and the length of the data being moved.

In some embodiments, buffer-to-buffer coding 322.7 acts similarly to buffer-to-buffer copy 322.6, except that it may insert an encoding step during the move. In some embodiments, buffer-to-buffer coding 322.7 uses at least one parity buffer 306.2 allocated in buffer memory 306. For example, data may be read from one buffer memory 306, XORed or erasure coded with the contents of parity buffer 306.2, and stored back to parity buffer 306.2. The buffer memory from which one set of data is read may not be on the same storage device as the parity buffer 306.2 and the erasure coded data it may contain. A buffer-to-buffer coding request may specify the source and destination storage devices and corresponding buffer memory locations, including parity buffer 306.2, and length of the data to be processed and moved.

Hosted services 322 may include LBA filter 322.8 for getting a valid LBA list for an NVM unit to assist in garbage collection. LBA filter 322.8 may parse a log of storage locations corresponding to the NVM unit, such as a page, to identify and filter out valid LBAs in the NVM unit. Service request handler 321 may receive an LBA filtering request that specifies a location in buffer memory, such as a starting location and number of entries in buffer log 306.3, where the log entries containing the page information are stored. The request may also specify a destination buffer location into which the resulting LBA list may be written by LBA filter 322.8. LBA filter 322.8 may parse each log entry into a host LBA field and the corresponding mapping information, look up mapping information in the entry in host FTL map 312.1 for the host LBA, and compare the mapping information from the log entry to the mapping information retrieved from host FTL map 312.1. LBA entries with matching log and map information may then be written to a filtered LBA list. Service request handler 321 may return a complete status message to the requester, such as SVC 110, when the specified log entries have been processed.

Hosted services 322 may include data mover 322.9 for selecting, serializing, and rewriting LBAs from a move list to assist in garbage collection. Data mover 322.9 may parse a log containing the LBA move list and the storage location to which the serialized data should be written. In some embodiments. service request handler 321 may receive a data move request that specifies a location in buffer memory, such a starting location and number of entries in buffer log 306.2, where the log entries containing the move list are stored. The data move request may also specify the allocation of locations in buffer memory 306 for serializing the data and the destination LBAs to be used for the serialized data.

Data mover 322.9 may read each LBA on the move list and use NVM manager 324 to access storage device FTL map 312.2 to locate and write each LBA to the specified serialization buffer space in buffer memory 306. LBAs from the move list may be written to buffer memory 306 until the serialization buffer space is full. Data mover 322.9 may then initiate a write-to-media operation through NVM manager 324. When all LBAs in the move list have been moved and the final batch is written to a medium or media, service request handler 321 may return a complete status message to the requester, such as SVC 110. In some embodiments, data may be left in the serialization buffer space and used for parity calculation in a parity storage device. For example, distributed parity module 332 in the parity storage device may be initiated and pointed to the serialization buffer space (repurposed as a transfer buffer 306.1) for the original write data to processed by buffer-to-buffer coding 322.7 (also in the parity storage device).

In some embodiments, NVM manager 324 includes base FTL services for storage device 120 and manages storage device FTL map 312.2. In some embodiments, storage device FTL map 312.2 provides a base level of FTL mapping for storage device 120. Storage device FTL map 312.2 may include allocation of storage locations with a defined size based on compatibility of with storage units in NVM devices 140.1, such as page size, and the same defined storage unit sizes may be used for buffer memory 306. For example, storage locations may be allocated as 4 KB or 8 KB pages. In some embodiments, allocation sizes for storage locations may correspond to larger multiplane NVM page sizes, such as 96 KB of 192 KB.

Storage device FTL map 312.2 may enable NVM-level management of storage locations. For example, NVM manager 324 may use storage device FTL map 312.2 for FTL management, including bad block management, bad block spare overprovisioning, and allocation of continuous or gap free logical space throughout the life of the NVM. In some embodiments, NVM manager 324 may also include error correction (e.g., low-density parity-check (LDPC) or Bose-Chaudhuri-Hocquenghem (BCH) codes) supported by error correction engine 316 and tuning of NVM access parameter (e.g., read levels, programming thresholds, etc.). NVM manager 324 may enable reads from LBA storage locations in NVM devices 140.1 to write in buffer memory 306 and reads from buffer memory 306 to writes in LBA storage locations in NVM devices 140.1. In some embodiments, NVM manager 324 does not manage any RAID-related redundancy or striping across the NVM under its management and RAID groups and striping may be managed across the storage devices in a distributed fashion.

In some embodiments, buffer access module 326 operates in conjunction with RDMA interface 304 to manage local and remote use of buffer memory 306. For example, local operations by NVM manager 324 may include writes and reads to buffer memory 306, read/write operations may include coordinates use of space in buffer memory 306 for both local and remote access, and other distributed operations may use space in buffer memory 306 as requested by SVC 110 or other storage devices. In some embodiments, buffer access module 326 may implement one or more buffer-related services for hosted services 322. For example, buffer access module 326 may allocate buffer space for receiving host data, data from another storage device, or other data related to distributed FTL services. In some embodiments, buffer access module 326 may allocate buffer memory 306 for specific purposes in conjunction with hosted services 322 and/or read/write operations, such as transfer buffer 306.1 for moving data between storage devices and/or the host, parity buffer 306.2 for receiving and updating parity data in parity storage devices, and log buffer 306.3 for storing sequential data management information related to hosted services 322 and/or read/write operations.

In some embodiments, buffer access module 326 is subordinate to buffer allocations by a remote buffer manager, such as device buffer manager 216 in SVC 110. For example, buffer access module 326 may receive and log buffer allocations by device buffer manager 216 and/or request buffer allocations from device buffer manager 216 for local use. In some embodiments, buffer access module 326 may also process a buffer flush command received from a remote buffer manager. For example, the buffer flush command may cause NVM manager 324 to write the contents of buffer memory 306 to NVM devices 140.1 and buffer access module 326 to clear the contents of buffer memory 306 for reuse. In some embodiments, buffer access module 326 may provide status back to a remote buffer manager when the buffer flush command is complete.

In some embodiments, distributed read module 328 completes local read operations when storage device 120 includes the destination storage location of a host read command or other read command. SVC 110 may initiate the read command. The read command may be addressed to storage device 120 based on a prior FTL lookup that identified the destination storage device for the read command. The read command may include the LBA range for the read and a destination buffer location in buffer memory 306.

Distributed read module 328 may then initiate a media read operation. For example, the media read operation may include instructions to NVM manager 324 to execute a read from a storage location on NVM devices 140.1 corresponding to the LBA range in the read request, based on the storage device FTL map 312.2 in FTL memory 312. The instruction may also indicate an allocated buffer location in buffer memory 306 for NVM manager 324 to write the data to. In some embodiments, the media read operation may also use buffer access module 326 to log the buffer allocation, make the buffer space available to NVM manager 324 for writing the read data, and/or ready RDMA interface 304 for the host data transfer from buffer memory 306 that may follow.

In some embodiments, when the data is read from NVM devices 140.1 and ready in buffer memory 306, distributed read module 328 may send a read complete status to the requesting system. The requesting system may then be able to continue host read operations based on the data available in the allocated buffer space in buffer memory 306. In some embodiments, distributed read module 328 may initiate a push transfer of data from buffer memory 306 using RDMA interface 304. In other embodiments, SVC 110, host 102, or an RDMA engine elsewhere in data storage system 100 may initiate the data transfer to host 102.

In some embodiments, distributed write module 330 completes local write operations when storage device 120 includes the destination storage location of a host write command or other write command. SVC 110 may initiate the write command. The write command may be addressed to storage device 120 based on a prior FTL lookup that identified the destination storage device for the write command. The write command may include a destination buffer location in buffer memory 306 for the host data transfer and LBA for the destination storage location.

Distributed write module 330 may use buffer access module 326 to allocate the buffer location in buffer memory 306 to receive the host data. RDMA interface 304 may be readied for the host data transfer. In some embodiments, distributed write module 330 may also use buffer access module 326 to log the buffer allocation and make the buffer space available to NVM manager 324 for reading the data to be written.

Distributed write module 330 may then initiate a media write operation. For example, the media write operation may include instructions to NVM manager 324 to execute a read from the allocated buffer space in buffer memory 306 for the host data and a write to a storage location on NVM devices 140.1 corresponding to the LBA range in the write request, based on the storage device FTL map 312.2 in FTL memory 312. NVM manager 324 may also update storage device FTL map 312.2 to reflect the newly written data. In some embodiments, when the data is read from buffer memory 306 and written to NVM devices 140.1, distributed write module 330 may send a write complete status to the requesting system. The requesting system may then be able to continue host write operations, which may include updates of host FTL and any parity operations.

In some embodiments, distributed parity module 332 supports local parity calculation, storage, and related host FTL mapping information updates initiated by parity host FTL updater 322.3. Buffer-to-buffer copy 322.6 may allow the parity storage device to pull data from the buffer of the destination storage device for a write request and write it to local buffer memory 306. For example, buffer-to-buffer copy 322.6 in the parity storage device may use an RDMA command to access a buffer in the other storage device as identified by parity host FTL updater 322.2.

Distributed parity module 332 may read local parity stripe data from NVM devices 140.1 using NVM manager 324, use error coding engine 314 to XOR the contents of parity buffer 306.2 with the local parity stripe data, and write the resulting data back to parity buffer 306.2. For example, buffer-to-buffer coding 322.7 may be used for this operation. The contents of parity buffer 306.2 may then be written to NVM devices 140.1 for parity storage. In some embodiments, the contents of parity buffer 306.2 may be written to NVM devices 140.1 when a separate command is received from a remote buffer manager, such as SVC 110. For example, parity buffer 306.2 may be allowed to accumulate a full stripe of information and then receive a buffer flush command to write the full parity stripe data to NVM devices 140.1.

Figure 4:
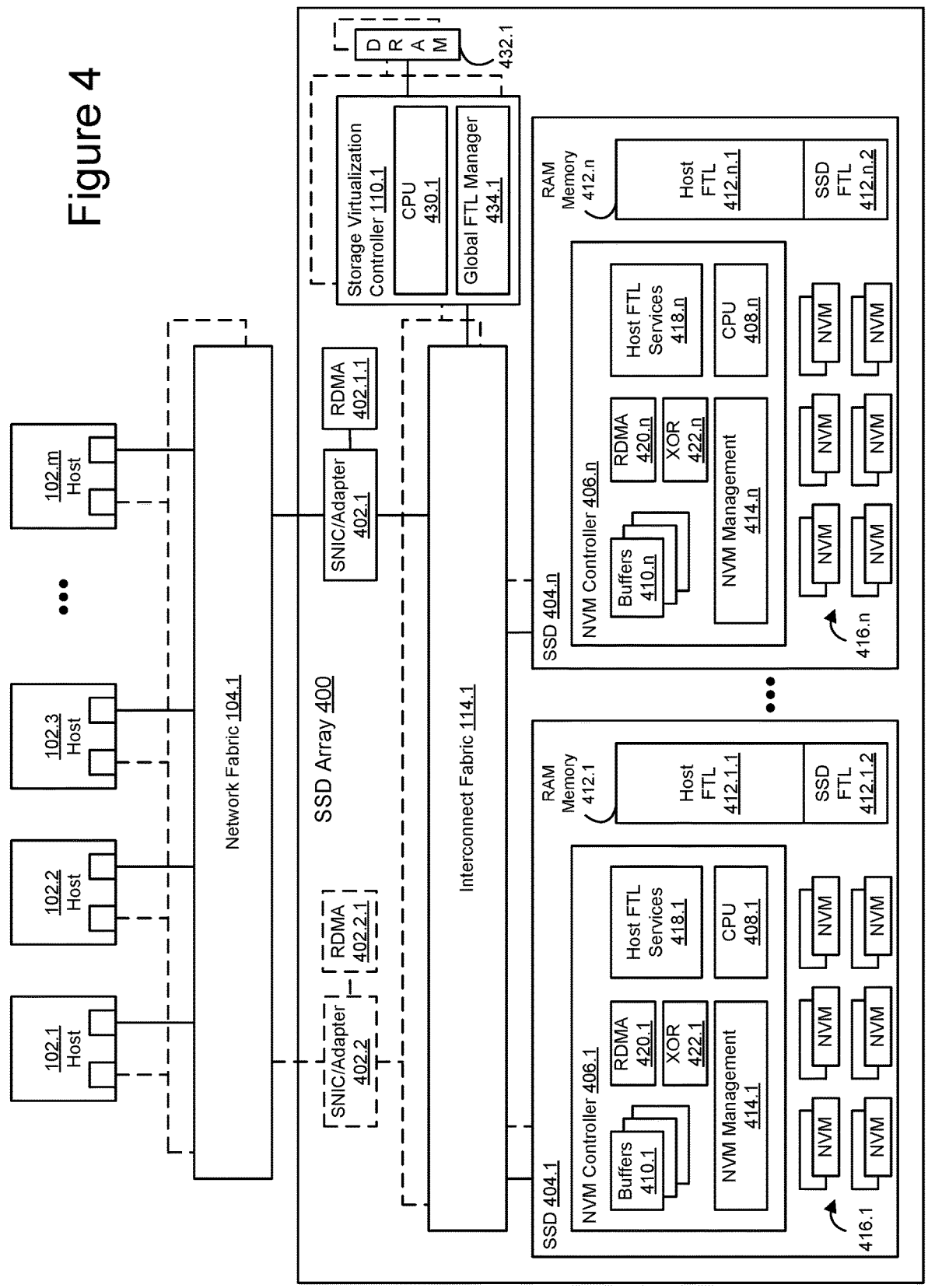
FIG. 4 schematically illustrates an example of a disaggregated storage architecture, including example configurations of the multi-device storage system of FIG. 1.

FIG. 4 illustrates an example implementation of a multi-device storage architecture with distributed read/write processing as may be used in a disaggregated storage system, in accordance with some embodiments. SSD array 400 may be a High Availability (HA) Redundant Array of Independent Disks (RAID) Bunch of Flash (BOF). As the name indicates, this example shows a bunch of flash drives, SSDs 404, in a Redundant Coding (RC) configuration, connected via an interconnect fabric 114 to facilitate high availability.

In some embodiments, one or more adapters or Storage Network Interface Cards (SNICs) 402 connect SSD array 400 to one or more hosts 102 via one or more network fabrics 104 and may include RDMA engine 402.1.1 for transferring data between components connected to interconnect fabrics 114 and network fabrics 104. The example shows one or more Storage Virtualization Controllers (SVCs) 110 connected to one or more backend Solid Storage Devices (SSDs, 404.1 through 404.n) and one or more network fabrics 104 (for e.g., Ethernet, Infiniband, peripheral component interconnect express (PCIe)) through one or more interconnect fabrics 114. In some embodiments, interconnect fabric 114 is PCIe or a similar fabric. In some embodiments, SVCs 110 are a part of the SNIC/Adapters 402 and/or interconnect fabric 114.

Storage virtualization controller 110.1 may be a separate system-on-a-chip (SOC), ASIC, FPGA, or similar component with its own CPU 430.1 and DRAM 432.1 executing a global FTL manager 434.1 to coordinate read/write requests from hosts 102.1-102.m. Furthermore, in some embodiments, each SVC 110 contains an inexpensive CPU 430 to perform initialization, management and other similar slow path activities, and fast path automation hardware, which completely handles fast path commands processing (e.g., data transfers between hosts 102 and backend SSDs 404), so that CPU 430 has little or no involvement in the processing of fast path commands (e.g., no involvement other than initializing or setting up SNIC/Adapters 402 (including RDMA engine 402.1.1), buffers 410, and RDMAs 420 to handle the operations).

In some embodiments, each SSD 404 is configured to support offloaded or distributed operations, as discussed in more detail below. Each SSD 404 has internal buffer memory organized as one or more buffers 410. In some embodiments, SSDs 404 support peer-to-peer communications between the SSDs, so that the SSDs 404 can transfer data between themselves, such as for performing parity calculation to a parity SSD with assistance from XOR modules 422, without external control. Each SSD 404 also has an NVM management module 414 that manages one or more non-volatile memory devices (NVMs) 416 and performs various flash management operations for the respective SSDs. The Host FTL services module 418 works in conjunction, or co-ordinates, with NVM management module 414 to implement various distributed operations, such as distributed read/write operations.

In some embodiments, one or more modules in NVM controller 406 perform offloaded services, offloaded from the one or more SVCs 110. Such services include global flash translation layer (FTL) addressing operations, parity computations (e.g., XOR, Reed-Solomon), Garbage Collection (GC) related functions, GC data transfers (via peer-to-peer communication), and other operations that are typically performed in the SVCs. Also, in some embodiments, operations that are delayed (e.g., part of stripe closing or garbage collection, to be executed in the future) are offloaded to the SSDs along with operations that require more immediate attention. With the support provided by peer SSDs, the SSDs 404 handle the offloaded operations in response to host commands and/or intermediate commands from SVC 110, in accordance with some embodiments.

An example SSD 404.1 may also include RAM memory 412.1 for storing both SSD FTL mapping 412.1.2 and a portion of host FTL mapping 412.1.1. Some SSDs have sufficient hardware and computational resources to support offloaded services, and only firmware changes are needed to implement the SSD portion of some of the embodiments described herein. The system architecture shown in FIG. 4 enables low cost disaggregated storage with nearly the same performance as backend SSDs, while supporting offloaded services, such as global FTL addressing, Line Speed Offloaded Coding (LSOC), write transactions, remapping, scale out, and Xcopy. The offloading of such services from hosts 102 using a storage system using the storage system architecture of FIG. 4 can lead to operational savings.

Additionally, as shown in FIG. 4, various portions of the communication fabric between hosts 102 and SSDs 404 may be provided in single (solid line) or redundant (dotted line) configurations. For example, redundant network fabric 104, SNIC/Adapter 402, interconnect fabric 114, and SVC 110 may be provided for additional failover protection. The redundant communication paths and SVCs may be less desirable in embodiments implementing distributed read/write operations as described herein, which may reduce the impact of power interruptions through structured use of persistent memories, drive-to-drive communications, and event logging.

Figure 5:
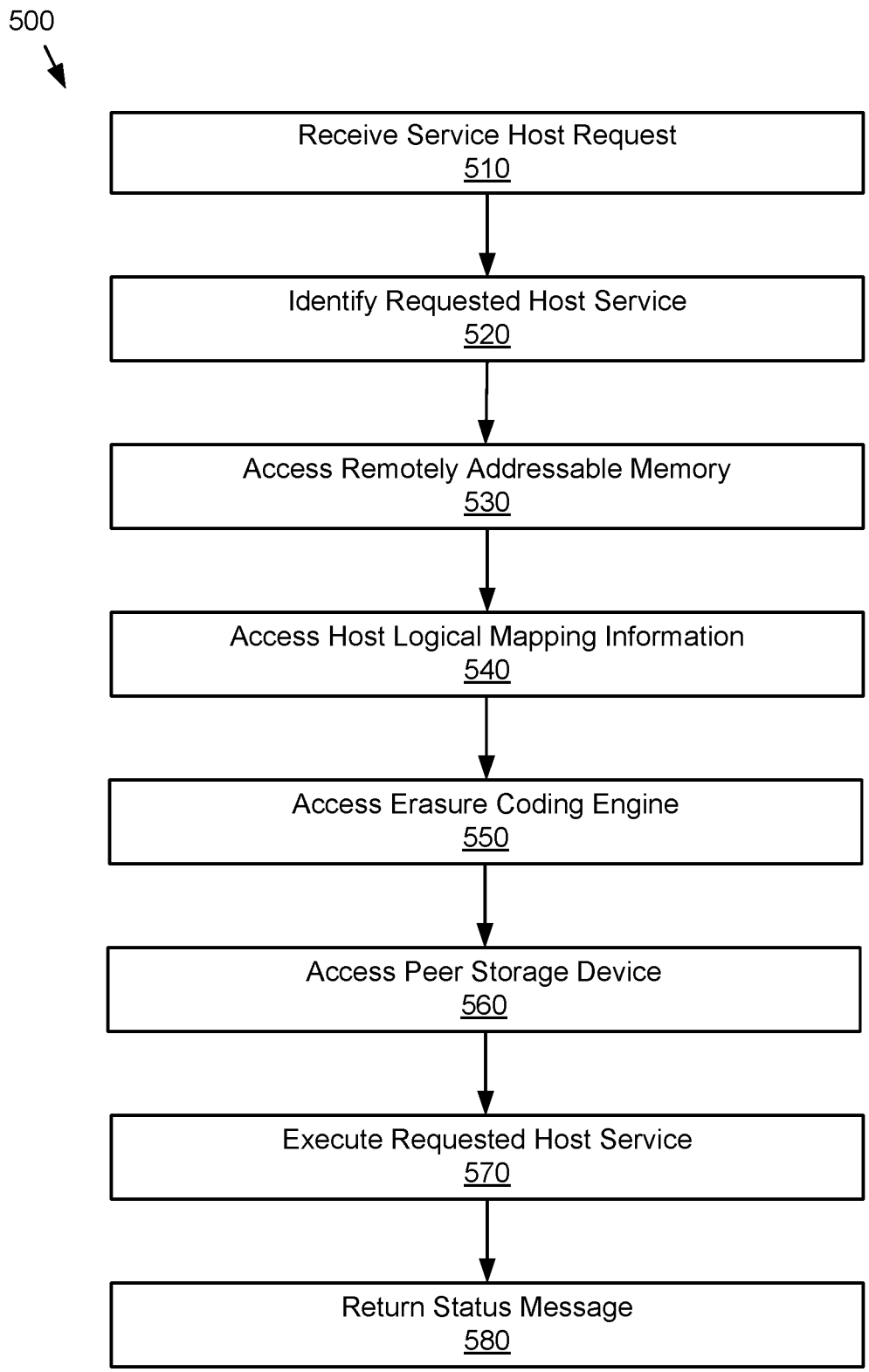
FIG. 5 illustrates an example of a method for handling a service host request using a storage device.

As shown in FIG. 5, storage device 120.1 operating within data storage system 100 may be operated according to a distributed or offloaded data management service for accessing local memory and/or compute resources of data storage device 120.1. For example, storage device 120.1 may respond to one or more service requests from a storage virtualization controller (e.g. SVC 110), a host (e.g. host 102), and/or one or more peer storage devices (e.g. storage devices 120) according to the method 500 illustrated by blocks 510-580 of FIG. 5.

At block 510, a service host request may be received by a target service host storage device. For example, when a host, server, peer storage device, or other network system using the data storage system for data storage needs to access a hosted service, it may send a service host request to the target service host storage device for the hosted service. The service host request may be routed within the storage system according to a storage device ID for receipt by a service request handler in the target service host storage device.

At block 520, a target service host storage device parses the received service host request to identify what host service has been requested from among the plurality of hosted services in the storage device. For example, the received service host request may include a type, format, and corresponding arguments to initiate or continue a hosted service. In some embodiments, each hosted service may have a corresponding process within the target host storage device that uses one or more local memory resources and/or local compute resources.

At block 530, a remotely addressable memory within the target host storage device may be accessed for completing the hosted service in the request. For example, a buffer memory accessible through RDMA may be allocated for one or more data transfers with a host or peer storage device. In some embodiments, remotely addressable memory may be allocated for receiving, logging, or returning data management information or used for calculation and storage of parity data.

At block 540, host logical mapping information within the target host storage device may be accessed for completing the hosted service in the request. For example, the target host storage device may host a portion of the host LBA mapping information for the storage system in a logical mapping memory and the request may relate to retrieving, updating, initializing, comparing, or rebuilding host LBA mapping information. In some embodiments, the host LBA mapping information accessed relates to host LBAs and/or host LBA mapping information stored on peer storage devices.

At block 550, an erasure coding engine within the target host storage device may be accessed for completing the hosted service in the request. For example, the target host storage device may include an erasure coding engine for XORing data to calculate parity. In some embodiments, the hosted service may include calculating parity for host data or LBA mapping data and using remotely addressable memory to read, store, and/or transfer parity data.

At block 560, a peer storage device may be accessed by the target host storage device for completing the hosted service in the request. For example, the target host storage device may transfer data from its remotely addressable buffer to the remotely addressable buffer of a peer storage device for parity calculation, data mirroring, rebuild, garbage collection, or another data management function. In some embodiments, peer storage devices may be able to send host service requests to other storage devices to complete their hosted service.

At block 570, the host service may be executed using the resources that have been accessed in blocks 520-560. Executing the host service may include using a variety of local memory resources for accessing, sharing, and storing data. Executing the host service may include a variety of local compute resources for executing the functions and input/output protocols to complete the hosted services. In some embodiments, executing the host services may include communicating with other resources and waiting for the requested resources to complete their requests.

At block 580, a status message may be returned to the requester. For example, a requested service complete message may be sent by a service request handler to the system or subsystem that initiated the service host request. In some embodiment, the status message may include one or more results of the service request and/or an indication of a buffer memory location where the service results have been stored.

Figure 6:
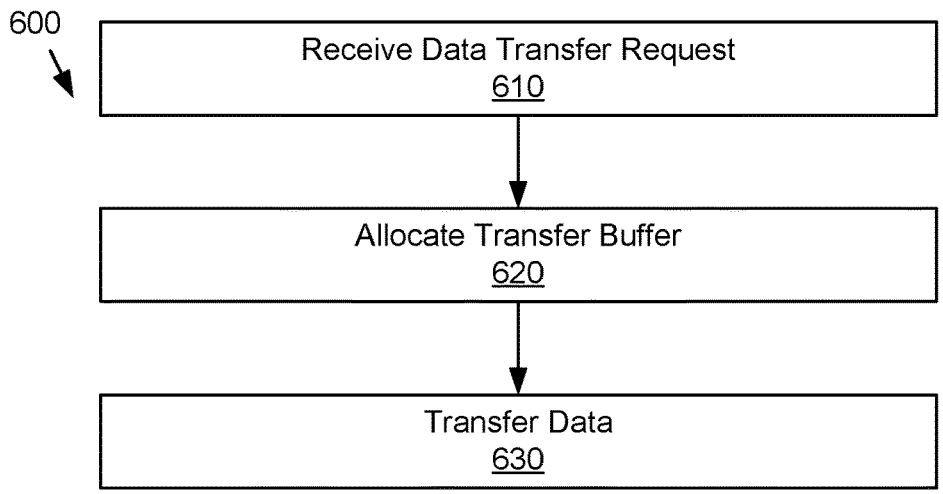
FIG. 6 illustrates an example of a method for providing transfer buffer services in a storage device.

As shown in FIG. 6, storage device 120.1 operating within data storage system 100 may be operated to handle a data transfer request. For example, storage device 120.1 may respond to one or more service requests from a storage virtualization controller (e.g. SVC 110), a host (e.g. host 102), and/or one or more peer storage devices (e.g. storage devices 120) according to the method 600 illustrated by blocks 610-630 of FIG. 6. In some embodiments, the data transfer request may be part of a hosted service request as described with regard to method 500 in FIG. 5.

At block 610, a data transfer request may be received by a target service host storage device. For example, when a host, server, peer storage device, or other network system needs to transfer data between two storage devices, between a storage device and a host, or within a storage device (such as for garbage collection), it may send a data transfer request to the target service host storage device. The data transfer request may be routed within the storage system according to a storage device ID for receipt by a service request handler in the target service host storage device. In some embodiments, a data transfer request may be a sub-request within another hosted service or a read/write operation.

At block 620, a transfer buffer space may be allocated within a remotely addressable memory. For example, a storage device may allocate a portion of a remotely addressable buffer memory for transferring data between the storage medium or media in the storage device and another storage location. In some embodiments, allocation of the transfer buffer space may be managed by a buffer manager outside the storage device that assigns the transfer buffer space as part of the data transfer request.

At block 630, data may be transferred using the transfer buffer space. For example, data to be transferred may be written to the transfer buffer space from one storage location and read from the transfer buffer space to a second storage location. In some embodiments, one of the storage locations may be the local storage medium or media of the storage devices and the second storage location may be in another system or component, such as a host system or peer storage device. The transfer to the second storage location may use a remote memory access protocol, such as RDMA.

Figure 7:
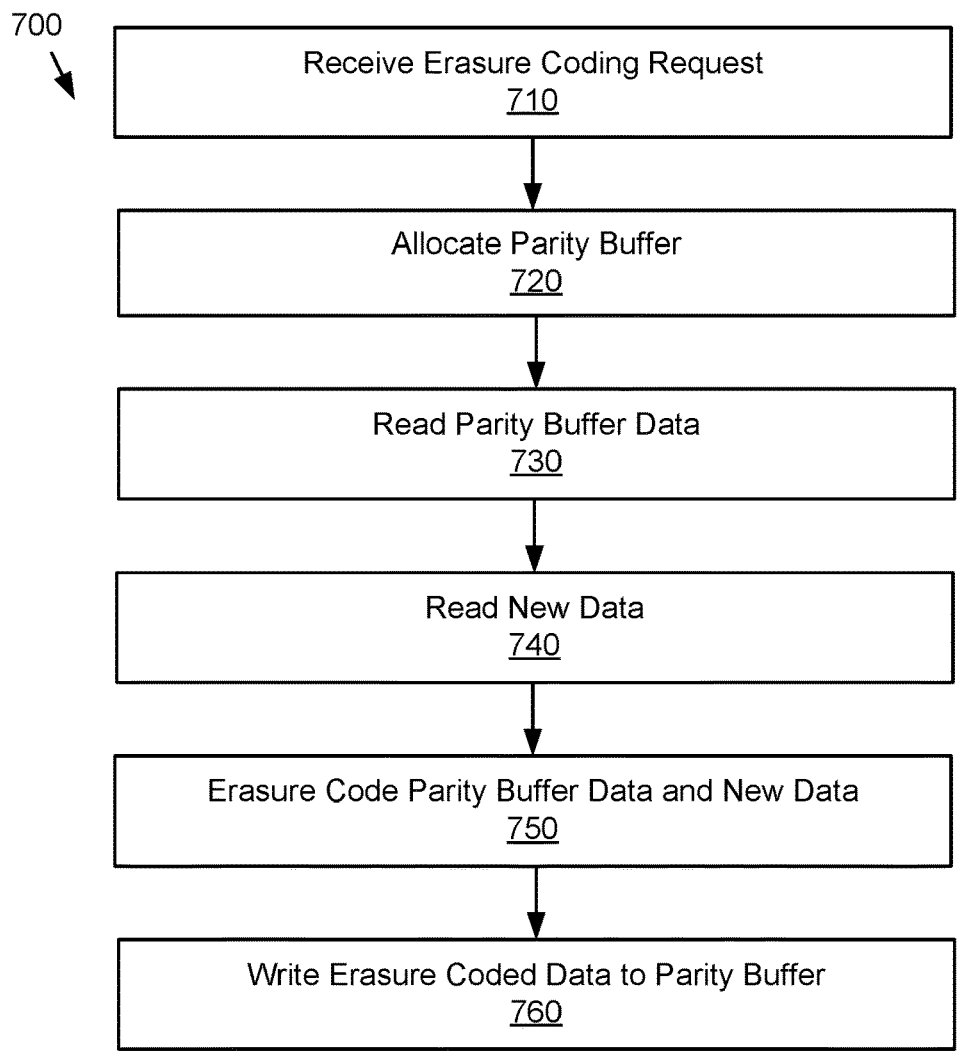
FIG. 7 illustrates an example of a method for providing parity buffer services in a storage device.

As shown in FIG. 7, storage device 120.1 operating within data storage system 100 may be operated to handle an erasure coding request. For example, storage device 120.1 may respond to one or more service requests from a storage virtualization controller (e.g. SVC 110), a host (e.g. host 102), and/or one or more peer storage devices (e.g. storage devices 120) according to the method 700 illustrated by blocks 710-760 of FIG. 7. In some embodiments, the data transfer request may be part of a hosted service request as described with regard to method 500 in FIG. 5.

At block 710, an erasure coding request may be received by a target service host storage device. For example, when a host, server, peer storage device, or other network system needs to erasure code data, such as for parity calculation, it may send an erasure coding request to the target service host storage device. The erasure coding request may be routed within the storage system according to a storage device ID for receipt by a service request handler in the target service host storage device. In some embodiments, an erasure coding request may be a sub-request within another hosted service or a read/write operation.

At block 720, a parity buffer space may be allocated within a remotely addressable memory. For example, a storage device may allocate a portion of a remotely addressable buffer memory for holding a first set of data to be used in a parity calculation. The parity buffer space may already include data from a prior data transfer and/or parity calculation or data may be transferred into the parity buffer space for use in the erasure coding request, such as using a data transfer request or designating a data source in the erasure coding request.

At block 730, parity buffer data may be read from the parity buffer space. For example, the first set of data for use in the erasure coding operation may be read from the parity buffer space. In some embodiments, the first set of data may be read from another location to initialize the parity buffer space.

At block 740, a new set of data may be read from another storage location. For example, a second set of data for use in the erasure coding operation may be read from a transfer buffer space in the storage device or a peer storage device. In some embodiments, the second set of data may be received in the erasure coding request, retrieved from storage medium or media in the storage device, or read from another source.

At block 750, the parity buffer data and the new data may be used for an erasure coding operation. For example, the first data set from the parity buffer may be XORed with the second set of data using an erasure coding engine in the storage device. In some embodiments, parity calculation may be performed on host data, logical mapping data, and/or other data management data being protected across storage devices and/or memory or storage media locations through a RAID or RAID-like storage configuration.

At block 760, the erasure coded data may be stored in the parity buffer space. For example, the new parity data calculated at block 750 may overwrite the first set of data retrieved from the parity buffer space at block 730. In some embodiments, the erasure coded data may be stored in a new parity buffer space or transferred to another storage location.

Figure 8:
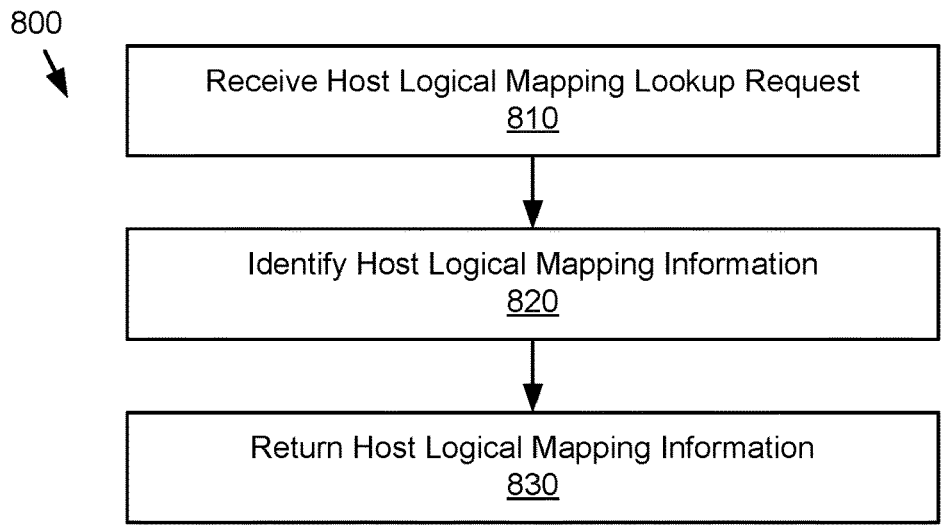
FIG. 8 illustrates an example of a method for providing logical map lookup services in a storage device.

As shown in FIG. 8, storage device 120.1 operating within data storage system 100 may be operated to handle a host logical mapping lookup request. For example, storage device 120.1 may respond to one or more service requests from a storage virtualization controller (e.g. SVC 110), a host (e.g. host 102), and/or one or more peer storage devices (e.g. storage devices 120) according to the method 800 illustrated by blocks 810-830 of FIG. 8. In some embodiments, the host logical mapping lookup request may be part of a hosted service request as described with regard to method 500 in FIG. 5.

At block 810, a host logical mapping lookup request may be received by a target service host storage device. For example, when a host, server, peer storage device, or other network system needs to lookup host LBA mapping information from the portion of the host LBA map in the storage device, such as for read, write, or data management operations, it may send a host logical mapping lookup request to the target service host storage device. The host logical mapping lookup request may be routed within the storage system according to a storage device ID for receipt by a service request handler in the target service host storage device. In some embodiments, a host logical mapping lookup request may be a sub-request within another hosted service or a read/write operation.

At block 820, host logical mapping information is identified using the host LBA mapping information stored in the storage device. For example, the host logical mapping lookup request may specify one or more LBAs that may be used as an index to the host LBA logical mapping information in a portion of the host LBA map. In some embodiments, each LBA entry may include a plurality of fields describing the mapping information for the LBA and identified information may include specified fields within the request.

At block 830, host logical mapping information may be returned to the requestor. For example, the identified host logical mapping information from block 820 may be included in a response or status message to the requestor. In some embodiments, the identified logical mapping information may be written to a log buffer space for retrieval by the requestor or further processing.

Figure 9:
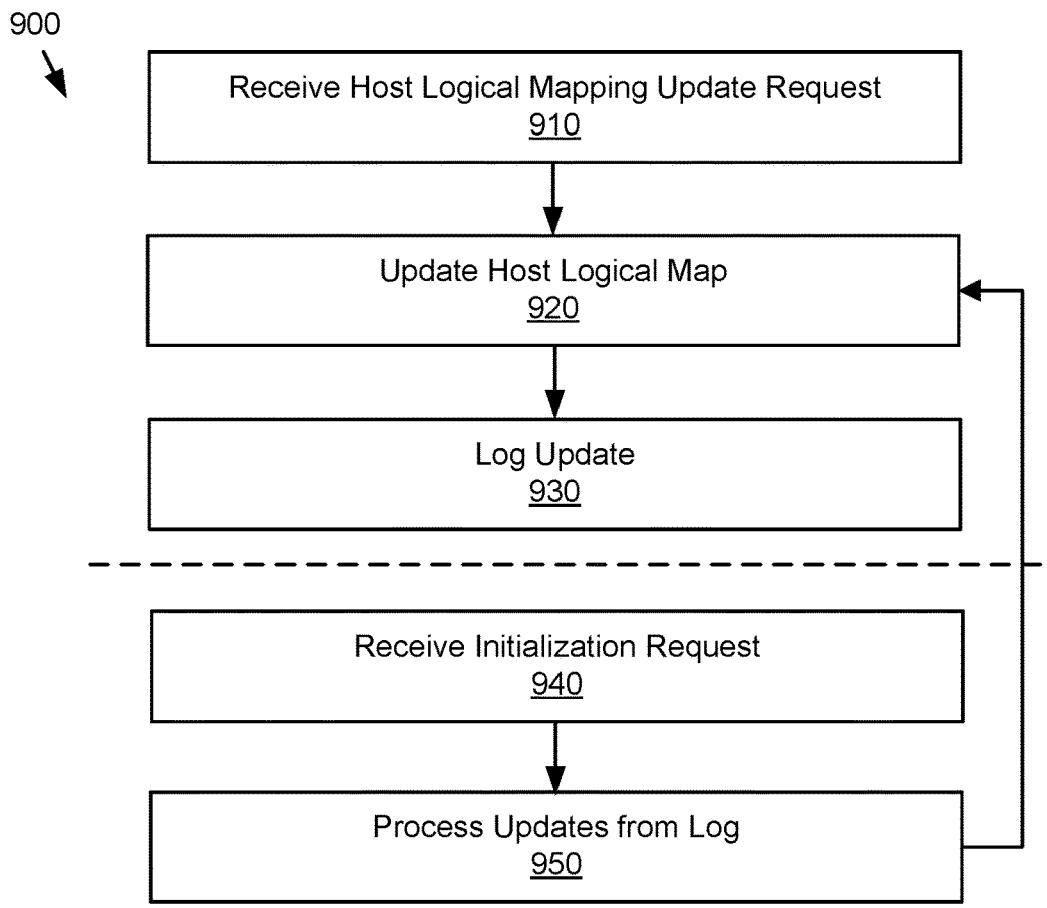
FIG. 9 illustrates an example of a method for updating logical mapping information in a storage device.

As shown in FIG. 9, storage device 120.1 operating within data storage system 100 may be operated to handle a host logical mapping update or initialization request. For example, storage device 120.1 may respond to one or more service requests from a storage virtualization controller (e.g. SVC 110), a host (e.g. host 102), and/or one or more peer storage devices (e.g. storage devices 120) according to the method 900 illustrated by blocks 910-950 of FIG. 9. In some embodiments, the host logical mapping update or initialization request may be part of a hosted service request as described with regard to method 500 in FIG. 5. Method 900 may include an initialization request for starting and/or verifying host logical mapping information in a storage device, such as following initial setup, power failure, and/or other interruptions.

At block 910, a host logical mapping update request may be received by a target service host storage device. For example, when a host, server, peer storage device, or other network system needs to update host LBA mapping information in the portion of the host LBA map in the storage device, such as for write or data management operations, it may send a host logical mapping update request to the target service host storage device. The host logical mapping update request may be routed within the storage system according to a storage device ID for receipt by a service request handler in the target service host storage device. In some embodiments, a host logical mapping update request may be a sub-request within another hosted service or a read/write operation.

At block 920, the host logical mapping information within the host LBA map in the storage device may be updated. For example, the host logical mapping update request may include one or more fields or complete LBA entries for new host logical mapping information to overwrite or add to the host LBA map in the storage device. In some embodiments, the new mapping information may be generated, at least in part, by the storage device, such as based on a write or move operation related to storage location in the storage medium or media of the storage device.

At block 930, the update to the host logical mapping information may be logged to a log buffer space. For example, the LBAs updated and a related timestamp may be stored in one or more log entries in a log buffer space in persistent memory. In some embodiments, data in the log buffer space is maintained in the event of power loss and may be accessible to peer storage devices, storage controllers, or other systems for verifying that updates have been processed.

At block 940, an initialization request for host logical mapping information may be received by a target service host storage device. For example, when a host, server, peer storage device, or other network system needs to setup and/or verify updated host LBA mapping information in the portion of the host LBA map in the storage device, such as after a power failure or other service interruption, it may send an initialization request to the target service host storage device. In some embodiments, the initialization request may include identifying a log buffer space in which LBA mapping information to be used for initializing a portion of the host LBA map may be stored. The initialization request may be routed within the storage system according to a storage device ID for receipt by a service request handler in the target service host storage device. In some embodiments, an initialization request may be a sub-request within another hosted service or a read/write operation.

At block 950, LBA mapping information from a log buffer may be processed for updating the host logical mapping information. For example, the initialization request may identify a log buffer space including LBA mapping information for a series of host LBAs and each LBA entry may be parsed against the portion of the host LBA map in the storage device to ensure that the mapping information in the log is reflected in the host LBA map. In some embodiments, any LBA entry in the log that is missing or different in the host LBA map may be updated as described in block 920. Each LBA entry may be parsed and selectively written or updated in this way.

Figure 10:
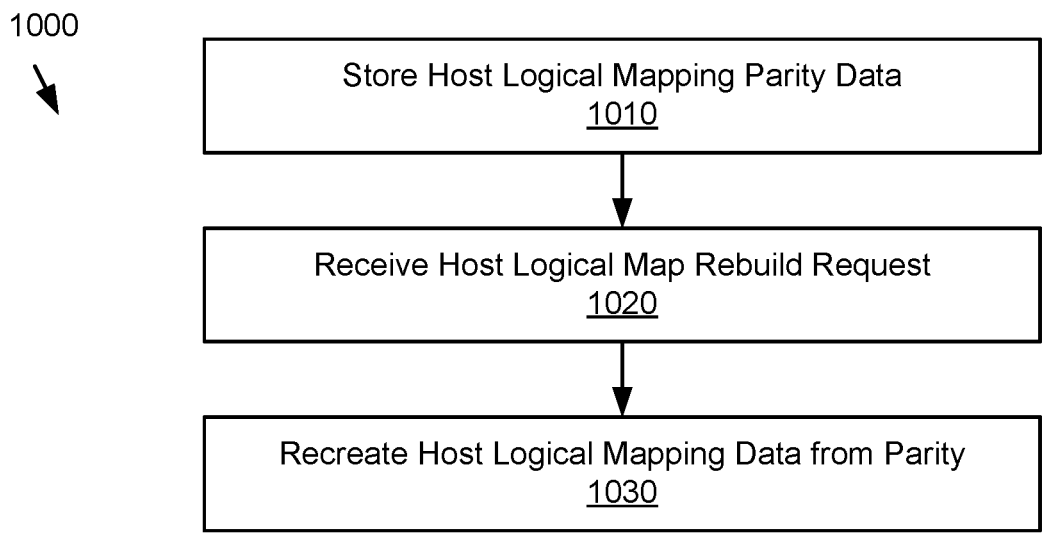
FIG. 10 illustrates an example of a method for recreating host logical mapping information in a storage device.

As shown in FIG. 10, storage device 120.1 operating within data storage system 100 may be operated to handle a host logical mapping rebuild request. For example, storage device 120.1 may respond to one or more service requests from a storage virtualization controller (e.g. SVC 110), a host (e.g. host 102), and/or one or more peer storage devices (e.g. storage devices 120) according to the method 1000 illustrated by blocks 1010-1030 of FIG. 10. In some embodiments, the host logical mapping rebuild request may be part of a hosted service request as described with regard to method 500 in FIG. 5.

At block 1010, parity data for host logical mapping information may be stored on a storage device. For example, parity data for the portion of the host LBA map stored on one storage device may be stored on at least one other storage device. In some embodiments, parity data for the host LBA map may be distributed across multiple storage devices in a storage array such that the portion of the host LBA map on any given storage device may be rebuilt from the parity data stored on the remaining storage devices.

At block 1020, a host logical map rebuild request may be received by a target service host storage device. For example, when a host, server, RAID controller, peer storage device, or other network system needs to rebuild host LBA mapping information for the portion of the host LBA map in a failed storage device it may send a host logical mapping rebuild request to the target service host storage device. In some embodiments, a host logical mapping rebuild request may be sent to each of the remaining storage devices in the array. The host logical mapping rebuild request may be routed within the storage system according to a storage device ID for receipt by a service request handler in the target service host storage device. In some embodiments, a host logical mapping rebuild request may be a sub-request within another hosted service or a read/write operation after a storage device failure has been identified.

At block 1030, the host logical mapping data with parity data on the target service host storage device may be recreated from the parity data. For example, the host logical map rebuild request may include a list of LBA entries corresponding to those in the host LBA map of the failed storage device and the target service host storage device may use an erasure coding engine to recreate the LBA entries in the list from the parity data. In some embodiments, parity data from multiple storage devices corresponding to the LBA entries may be used for recreating the data and remotely addressable memories may be used to share parity data and recreated host LBA mapping information among the peer drives and transferring it to a rebuilt or replacement storage device.

Figure 11:
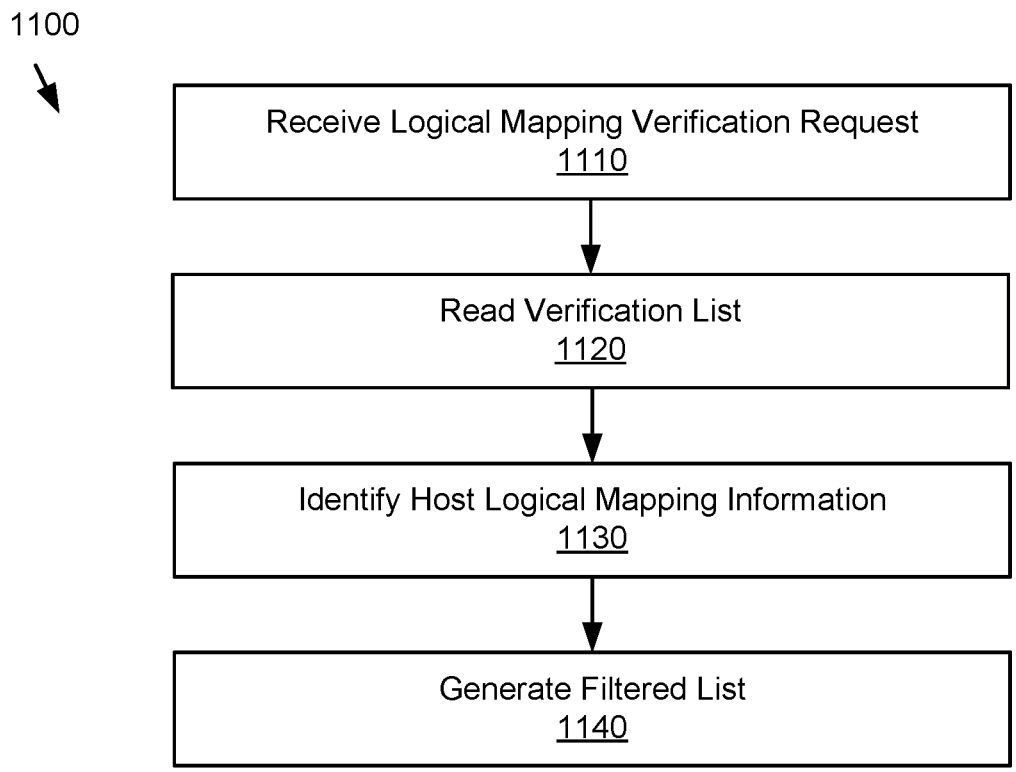
FIG. 11 illustrates an example of a method for verifying logical mapping information in a storage device.

As shown in FIG. 11, storage device 120.1 operating within data storage system 100 may be operated to handle a host logical mapping verification request. For example, storage device 120.1 may respond to one or more service requests from a storage virtualization controller (e.g. SVC 110), a host (e.g. host 102), and/or one or more peer storage devices (e.g. storage devices 120) according to the method 1100 illustrated by blocks 1110-1140 of FIG. 11. In some embodiments, the host logical mapping verification request may be part of a hosted service request as described with regard to method 500 in FIG. 5.

At block 1110, a host logical mapping verification request may be received by a target service host storage device. For example, when a host, server, peer storage device, or other network system needs to verify host LBA mapping information from the portion of the host LBA map in the storage device, such as for garbage collection or other data management operations, it may send a host logical mapping verification request to the target service host storage device. The host logical mapping verification request may be routed within the storage system according to a storage device ID for receipt by a service request handler in the target service host storage device. In some embodiments, a host logical mapping lookup request may be a sub-request within another hosted service or a read/write operation.

At block 1120, a verification list of host LBAs may be read from a log buffer space. For example, the host logical mapping verification request may specify a remotely addressable memory location including a list of host LBAs and corresponding mapping information for verification. In some embodiments, the list of host LBAs may correspond to page information being used in a garbage collection operation.

At block 1130, corresponding host LBA entries in the host LBA map may be identified for comparison to the verification list. For example, host LBA mapping information corresponding to each of the host LBAs in the list may be retrieved from the host LBA map in the storage device. In some embodiments, as each LBA is parsed from the verification list entry, the corresponding entry from the host LBA map is identified for comparison.

At block 1140, a filtered list of valid LBAs is generated based on comparing the verification list entry to the host LBA map entry. For example, if the mapping information in the verification list entry matches the host LBA map entry, then the LBA is verified and written to a verified LBA list to be returned to the requester. In some embodiments, the host logical verification request may specify a remotely addressable memory location for storing the verified list of LBAs.

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disc read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g., through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

What is claimed is:
1. A storage device, comprising:
at least one storage medium;

a fabric interface configured to communicate with a plurality of peer storage devices over an interconnect fabric between the fabric interface and the plurality of peer storage devices;
a logical mapping memory configured to include:
storage device media logical mapping information for the at least one storage medium, wherein the storage device media logical mapping information is configured in continuous logical blocks with a media block size equal to a page programming size of the at least one storage medium; and
host logical mapping information for at least one peer storage device of the plurality of peer storage devices, wherein the host logical mapping information is configured in host logical blocks with a host block size smaller than the media block size;
a service request handler configured to identify a requested hosted service from a service host request received through the fabric interface; and
a plurality of hosted services configured to access the logical mapping memory for data operations for the plurality of peer storage devices, wherein the service host request is configured to initiate at least the requested hosted service of the plurality of hosted services.

2. The storage device of claim 1, further comprising:
a media manager configured to manage a flash translation layer for the at least one storage medium, wherein the media manager is further configured to define, in the flash translation layer, continuous logical blocks with the media block size in the at least one storage medium.

3. The storage device of claim 1, wherein the plurality of hosted services includes:
identifying, using at least one host logical block address, host logical mapping information for at least one peer storage device of the plurality of peer storage devices from the logical mapping memory; and
sending the identified host logical mapping information to a requestor.

4. The storage device of claim 1, wherein the plurality of hosted services includes updating the host logical mapping information based on a change in at least one updated peer storage device of the plurality of peer storage devices.

5. The storage device of claim 4, wherein the service request handler is further configured to receive the service host request from the at least one updated peer storage device of the plurality of peer storage devices where the change occurred.

6. The storage device of claim 4, further comprising:
a remotely addressable memory configured to include a log buffer space, wherein:
the plurality of hosted services includes logging requested updates to the host logical mapping information in the log buffer space; and
the requested hosted service includes processing requested updates from the log buffer space after an initialization event.

7. The storage device of claim 1, wherein:
the host logical mapping information includes host logical mapping parity data for host logical mapping information stored in at least one peer storage device of the plurality of peer storage devices; and
the requested hosted service includes recreating host logical mapping information from the host logical mapping parity data.

8. The storage device of claim 1, wherein the requested hosted service includes:

receiving a verification list of host logical block addresses;
identifying host logical mapping information corresponding to the verification list of host logical block addresses; and
generating, based on the identified host logical mapping information, a filtered list of host logical block addresses for garbage collection.

9. The storage device of claim 8, further comprising:
a remotely addressable memory, wherein:
the service request handler is further configured to receive the verification list of host logical block addresses from a garbage collection module writing the verification list into the remotely addressable memory; and
the requested hosted service further includes writing the filtered list of host logical block addresses into the remotely addressable memory for access by the garbage collection module.

10. The storage device of claim 1, further comprising:
a non-volatile memory controller, configured to host the service request handler and the plurality of hosted services, including:
a processor; and
a memory interface for the logical mapping memory.

11. The storage device of claim 1, wherein the media block size is a multiple of the host block size with a multiplication factor of at least four.

12. A computer-implemented method for execution by a storage device, comprising:
communicating with a plurality of peer storage devices over an interconnect fabric;
storing, in a logical mapping memory in the storage device, storage device media logical mapping information for at least one storage medium in the storage device, wherein the storage device media logical mapping information is configured in continuous logical blocks with a media block size equal to a page programming size of the at least one storage medium;
storing, in the logical mapping memory in the storage device, host logical mapping information for at least one peer storage device of the plurality of peer storage devices, wherein the host logical mapping information is configured in host logical blocks with a host block size smaller than the media block size;
storing a plurality of hosted services configured to access the logical mapping memory for data operations for the plurality of peer storage devices;
receiving a service host request from a service requester;
identifying a requested hosted service from the service host request;
executing the requested hosted service using the logical mapping memory; and
returning, responsive to the requested host service being completed, a message to the service requester.

13. The computer-implemented method of claim 12, further comprising:
managing, by the storage device, a flash translation layer for the at least one storage medium; and
defining, in the flash translation layer, continuous logical blocks in the at least one storage medium, wherein the continuous logical blocks:
are comprised of a plurality of host logical blocks; and
have the media block size.

14. The computer-implemented method of claim 12, wherein executing the requested hosted service includes:

identifying, using at least one host logical block address, host logical mapping information for at least one peer storage device of the plurality of peer storage devices from the logical mapping memory; and sending the identified host logical mapping information to a requestor.

15. The computer-implemented method of claim 12, wherein executing the requested hosted service includes updating the host logical mapping information based on a change in at least one updated peer storage device of the plurality of peer storage devices.

16. The computer-implemented method of claim 15, wherein executing the requested hosted service includes:

logging, in a log buffer space of a remotely addressable memory in the storage device, requested updates to the host logical mapping information; and processing, responsive to an initialization event, requested updates from the log buffer space.

17. The computer-implemented method of claim 12, wherein:

the host logical mapping information includes host logical mapping parity data for host logical mapping information stored in at least one peer storage device of the plurality of peer storage devices; and executing the requested hosted service includes recreating host logical mapping information from the host logical mapping parity data.

18. The computer-implemented method of claim 12, wherein executing the requested hosted service includes:

receiving a verification list of host logical block addresses;

identifying host logical mapping information corresponding to the verification list of host logical block addresses; and generating, based on the identified host logical mapping information, a filtered list of host logical block addresses for garbage collection.

19. The computer-implemented method of claim 18, wherein:

receiving the service host request includes receiving the verification list of host logical block addresses from a garbage collection module writing the verification list into a remotely addressable memory of the storage device; and executing the requested hosted service includes writing the filtered list of host logical block addresses into the remotely addressable memory for access by the garbage collection module.

20. A system, comprising:

a plurality of peer storage devices configured to communicate over an interconnect fabric;

means for storing, in a logical mapping memory in each peer storage device of the plurality of peer storage devices, storage device media logical mapping information for at least one storage medium in the peer storage device, wherein the storage device media logical mapping information is configured in continuous logical blocks with a media block size equal to a page programming size of the at least one storage medium;

means for storing, in the logical mapping memory in each peer storage device of the plurality of peer storage devices, host logical mapping information for at least one other peer storage device of the plurality of peer storage devices, wherein the host logical mapping information is configured in host logical blocks with a host block size smaller than the media block size;

means for storing, in each peer storage device of the plurality of peer storage devices for processing by a processor of the peer storage device, a plurality of hosted services configured to access the logical mapping memory for data operations for the plurality of peer storage devices;

means for receiving, in a target peer storage device of the plurality of peer storage devices, a service host request for a requested hosted service from a service requester;

means for executing, by the target peer storage device, the requested hosted service using the logical mapping memory and the processor of the target peer storage device; and means for returning, by the target peer storage device and responsive to the requested host service being completed, a message to the service requester.

* * * * *